(12) United States Patent
Harada et al.

(10) Patent No.: US 6,499,893 B2
(45) Date of Patent: Dec. 31, 2002

(54) IMAGE-RECORDING DEVICE

(75) Inventors: Akinori Harada, Kanagawa (JP); Shintaro Washizu, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/854,936

(22) Filed: May 15, 2001

(65) Prior Publication Data

US 2002/0015595 A1 Feb. 7, 2002

(30) Foreign Application Priority Data

May 16, 2000 (JP) ........................................ 2000-143910

(51) Int. Cl.⁷ .............................................. G03B 13/00
(52) U.S. Cl. ........................ 396/575; 396/583; 219/216
(58) Field of Search ................................ 396/575, 583; 219/216; 355/400, 402, 405, 27–29

(56) References Cited

U.S. PATENT DOCUMENTS 4,799,085 A * 1/1989 Nagumo et al. ............ 355/405

FOREIGN PATENT DOCUMENTS

| EP | 0734870 A2 | 10/1996 |
| EP | 1152293 A2 | 11/2001 |
| JP | 10-44604 | * 2/1998 |
| WO | WO 98/10333 | 3/1998 |

OTHER PUBLICATIONS

European Search Report for 01111794.2–2115–, dated Jul. 4, 2002.

* cited by examiner

*Primary Examiner*—Della J. Rutledge
(74) *Attorney, Agent, or Firm*—Sughrue Mion, PLLC

(57) ABSTRACT

An image-recording device that improves processing speed for image-recording that is carried out using a light and heat sensitive recording material. At the same time as irradiation of the light and heat sensitive recording material with light by a light source for fixing, a heating device heats the light and heat sensitive recording material. Because photo-fixing/photo-decolorization is carried out while the light and heat sensitive recording material is heated, viscosity of the system decreases, and dispersibility of active radicals increases. Due to this activation of radicals, a photopolymerization reaction and a photo-decolorization reaction accelerate, so that efficiencies of fixing and decolorizing increase.

20 Claims, 6 Drawing Sheets

IMAGE-RECORDING DEVICE

BACKGROUND OF THE INVENTION

1. Field of the Invention

The present invention relates to an image-recording device and, in particular, to an image-recording device which records an image using a light and heat sensitive recording material.

2. Description of the Related Art

In an image-recording device which is used for printing silver halide photographs, photographing is carried out using a film such as a negative film, a positive film or the like, and image information recorded on the film, after development, is optically printed on printing paper. Then, the printing paper is processed with a processing solution, such that a print is obtained. Such an image-recording device usually utilizes a wet process that uses a processing solution. With such an image-recording device, the size of a processing device tends to be large, and thus processing costs are high.

As a method of processing a photosensitive material using silver halide, there has been developed an easy and rapid processing method which utilizes heat development. However, in this heat-development process, a dye generated by heat development is transferred to an image-receiving material, and the side of the image-receiving material subjected to transfer is used as a print. Thus, there is a drawback in that waste products are generated.

Currently, an image-recording device which utilizes a completely dry system free of waste products is being proposed. In this image-recording device, multiple processes are carried out with an optical recording section, a heat-development section, a photo-fixing section and the like, so that an image is formed on a light and heat sensitive recording material. Specifically, at an image exposure section, a light beam is irradiated onto the light and heat sensitive recording material to record a latent image. At the heat-development section, heat is applied to the latent image recorded on the light and heat sensitive recording material, and the latent image is thereby developed. Then, at the photo-fixing section, the developed image is irradiated with light and is fixed.

When the image is fixed using a light source lamp of the photo-fixing section, fixing takes several minutes, because of characteristics of the light and heat sensitive recording material. Thus, there is a problem in that the time required for processing in the photo-fixing section is long, and the overall speed of image-recording processing is significantly slowed.

SUMMARY OF THE INVENTION

The present invention has been devised in order to solve the above-described problems, and an object of the present invention is to provide an image-recording device which enables an improvement of processing speed when image-recording using a light and heat sensitive recording material. In a first aspect of the present invention, the present invention has: an optical recording section which exposes a light and heat sensitive recording material with light for recording a latent image; a heat-development section, downstream of the optical recording section, which develops the latent image by heating; and a photo-fixing section, downstream of the heat-development section, which brings a film surface of the light and heat sensitive recording material to a temperature from 30 to 200° C. and irradiates light for fixing the developed image.

In accordance with the present invention, a recording material which uses a composition which is cured by light may be used as the photosensitive thermal material. In a case of using such a light and heat sensitive recording material, the composition which is cured with light is photo-cured by exposing the recording material with light which has been passed through or reflected by an original of the image or by carrying out exposure with light scanning using image data, such that a latent image is formed. Thereafter, when the light and heat sensitive recording material is heated, at an uncured portion corresponding to the latent image, components which relate to color formation or decolorization move within the recording material, and a color image is formed. Then, when the surface of the light and heat sensitive recording material is irradiated with light, the formed image is fixed and a non-image portion is decolorized. This process is useful not only for recording black-and-white images but also for recording color images. Now, the photo-fixing means heats the film surface of the light and heat sensitive recording material to from 30 to 200° C., as well as irradiating the light and heat sensitive recording material with light. Consequently, radical activation in the light and heat sensitive recording material accelerates, so efficiency of a photopolymerization reaction and efficiency of photo-decolorization increase.

The high temperature of the film surface of the light and heat sensitive recording material at the photo-fixing section may be achieved by retaining heat applied at the heat-development section. That is, a part of the function of the photo-fixing section may overlap the function of the heat-development section, and image-fixing by the photo-fixing means is accelerated using preheat generated at the heat-development section during heat-development processing. Thus, energy consumption during heating by the photo-fixing means can be reduced, and the whole device can be made more compact. Further, the photo-fixing section may heat the film surface of the light and heat sensitive recording material by photo-heating.

DESCRIPTION OF THE PREFERRED EMBODIMENTS

Hereinafter, embodiments of the present invention will be described with reference to the drawings. In the embodiments, the present invention is applied to an image-recording device which records an image using a color light and heat sensitive recording material, in which three monochrome light and heat sensitive recording layers (which hereinafter are occasionally referred to as "recording layers") are superposed on a support. Each light and heat sensitive recording layer forms a color corresponding to one of yellow, magenta and cyan.

(First Embodiment)

Figure 1:
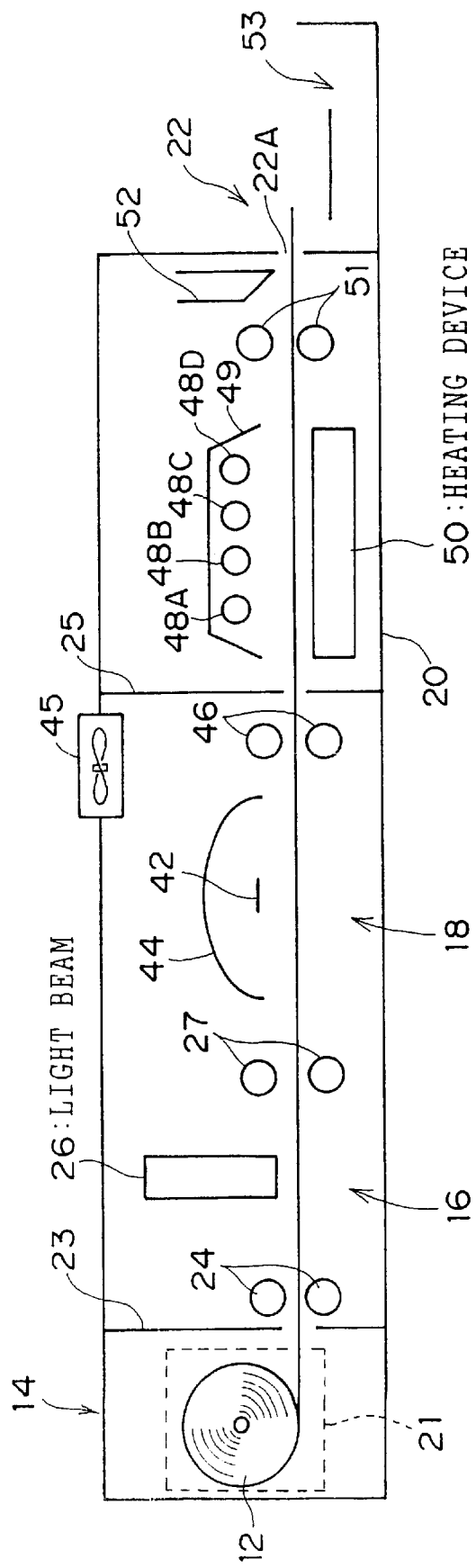
FIG. 1 is a schematic view showing the structure of an image-recording device relating to a first embodiment.

FIG. 1 shows a schematic structure of an image-recording device relating to a first embodiment, which uses a light and heat sensitive recording material 12 wound in a roll. As shown in FIG. 1, provided within a housing of the image-recording device are: an accommodating section 14 for accommodating the light and heat sensitive recording material 12, an optical recording section 16 which exposes the light and heat sensitive recording material 12 supplied from the accommodating section 14 and records a latent image, a heat-development section 18 for developing the latent image by heating, a photo-fixing section 20 for fixing a developed image by irradiation of light, and a discharge section 22 for discharging the light and heat sensitive recording material 12 having the image recorded thereon. The accommodating section 14, the optical recording section 16, the heat-development section 18, the photo-fixing section 20 and the discharge section 22 are arranged horizontally in that order.

Conveying roller pairs 24, 27, 46 and 51 for nipping and conveying the light and heat sensitive recording material 12 are disposed between the respective sections. These conveying roller pairs 24, 27, 46 and 51 form a conveying path for conveying the light and heat sensitive recording material 12 in a direction from the accommodating section 14 to the discharge section 22. The conveying roller pairs 24, 27, 46 and 51 are connected to a conveyance driving section (not shown) and controlled thereby.

The accommodating section 14 is separated from the optical recording section 16 by a partition plate 23, which has an opening that enables the light and heat sensitive recording material 12 to pass through. The heat-development section 18 is separated from the photo-fixing section 20 by a partition plate 25, which has an opening that enables the light and heat sensitive recording material 12 to pass through. A discharge opening 22A, through which the light and heat sensitive recording material 12 is discharged outside, is formed at the discharge section 22. A cutter 52 for cutting the light and heat sensitive recording material 12 into image-forming areas is provided within the photo-fixing section 20, in the vicinity of the discharge opening 22A.

A magazine 21 for accommodating the light and heat sensitive recording material 12, which is rolled with a recording layer side toward the inside of the roll, is accommodated within the accommodating section 14. A pair of conveying rollers 24 is disposed at the optical recording section 16 side of the opening formed in the partition plate 23. The pair of conveying rollers 24 nips the light and heat sensitive recording material 12 and rotates, so that the light and heat sensitive recording material 12 is drawn, with the recording layer side thereof facing upward, from the magazine 21 in the accommodating section 14. Then, the light and heat sensitive recording material 12 is conveyed along a predetermined conveying path and is supplied to the optical recording section 16, which is disposed further downstream in the conveying direction.

Figure 2:
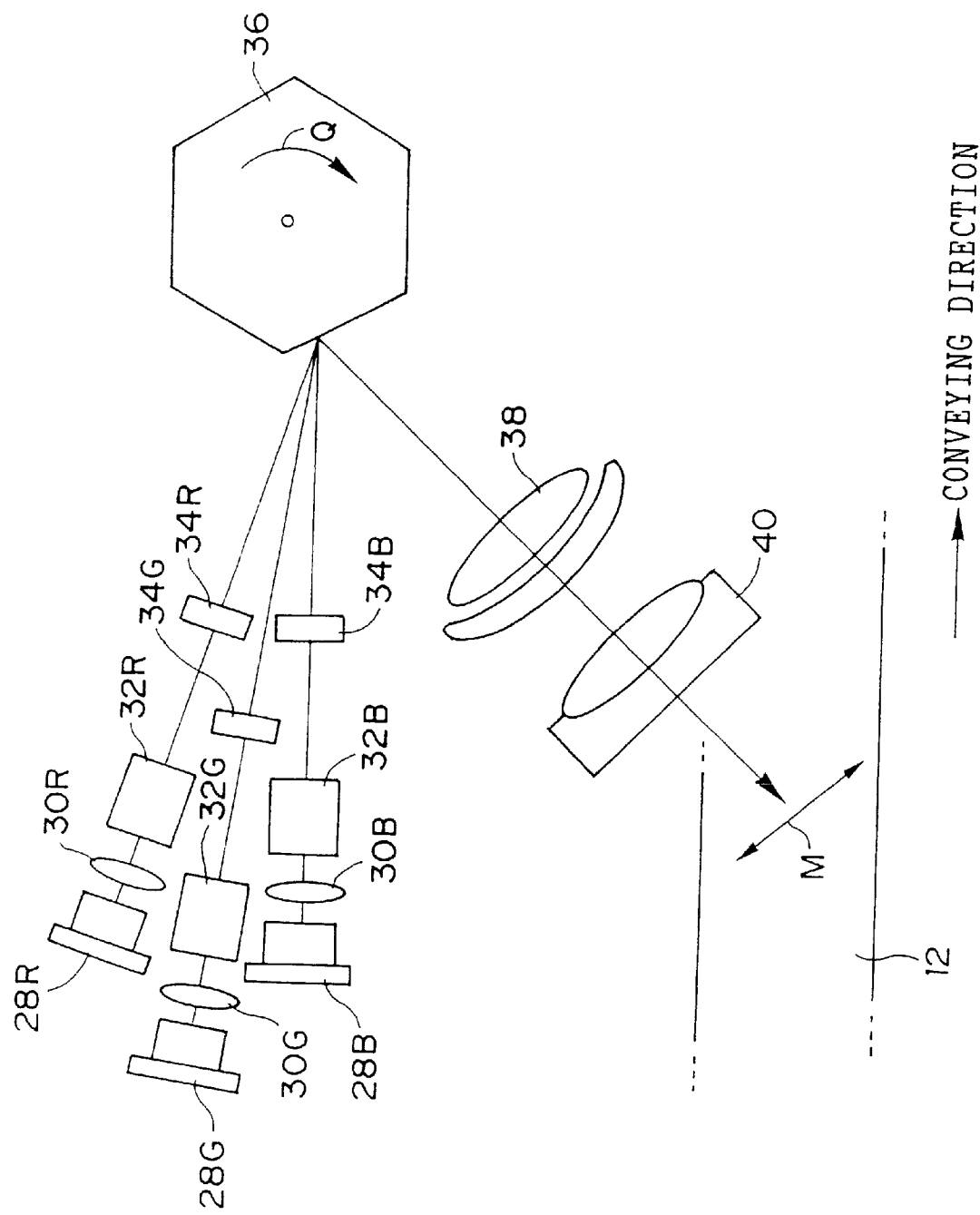
FIG. 2 is a schematic view showing the structure of a light beam scanning device of the image-recording device relating to the first embodiment.

The optical recording section 16 is provided with a light beam scanning device 26 which is disposed above the conveying path. The light beam scanning device 26 includes, as shown in FIG. 2, a red laser light source 28R, a green laser light source 28G and a blue laser light source 28B. Collimator lenses 30R, 30G and 30B, optical modulators 32R, 32G and 32B, which are formed by acoustic optical modulators (AOMs) or the like, and cylindrical lenses 34R, 34G and 34B are provided in correspondence with the respective laser light sources. The optical modulators 32R, 32G and 32B are driven by a modulator driving section (not shown). A polygon mirror 36, an fθ lens 38 and a cylindrical lens 40 are disposed at a light exit side of the cylindrical lenses 34R, 34G and 34B.

The laser sources 28R, 28G and 28B are not especially limited and, besides semiconductor lasers, solid state lasers, fiber lasers, wave length conversion solid state lasers, gas lasers, surface emitting lasers and the like can be used. If a semiconductor laser is used, the semiconductor laser may be directly modulated without use of an exterior modulator such as an acoustic optical modulator (AOM) or the like.

As the laser light sources 28R, 28G and 28B, lasers having an intensity maximum in the wavelength range of 300 to 1,100 nm can be used. If the wavelength thereof is shorter than 300 nm, the system cannot be made inexpensive, because there are no appropriate light sources in such a wavelength range. Most light and heat sensitive recording materials which exhibit sensitivity in a wavelength of 1,100 nm or longer are unstable, and if a light source having a wavelength of 1,100 nm or longer is used, it will be difficult to design a light and heat sensitive recording material having long-term stability. In the first embodiment, a semiconductor laser whose central excitation wavelength is 680 nm is used as the red laser light source 28G. A semiconductor laser-excited wave length conversion solid laser is used as the green laser light source 28G. A wave length conversion solid laser whose central excitation wavelength is 473 nm is used as the blue laser light source 28B.

A maximum irradiation amount of light onto the surface of the light and heat sensitive recording material 12 is preferably 0.01 to 50 mJ/cm$^2$ and more preferably 0.05 to 10 mJ/cm$^2$. If the maximum irradiation amount of light exceeds 50 mJ/cm$^2$, the exposure time will be long, and the convenience of the system will be lost. Also, the light source will be large, resulting in high costs of the system. In consideration of usual sensitivity of the light and heat sensitive recording material 12, the maximum irradiation amount of light needs to be at least 0.01 mJ/cm$^2$. Even if the light and heat sensitive recording material has high sensitivity, if the maximum irradiation amount of light is less than 0.01 mJ/cm$^2$, a light blocking device for cutting off light from outside will be necessary, resulting in high costs of the system.

The respective laser lights emitted from the laser light sources 28R, 28G and 28B are made parallel by the collimator lenses 30R, 30G and 30B. Then, the parallel lights enter the optical modulators 32R, 32G and 32B. Modulation signals from the modulator driving section (not shown) are inputted to the optical modulators 32R, 32G and 32B, and the intensities of the respective laser lights are modulated in accordance with these inputted modulation signals. The laser lights whose intensities have been modulated by the optical modulators 32R, 32G and 32B are collected onto a surface of the polygon mirror 36 by the cylindrical lenses 34R, 34G and 34B. Laser light reflected by the polygon mirror 36 is corrected by the fθ lens 38 and the cylindrical lens 40 and then converged on the light and heat sensitive recording material 12 in a dot configuration. The polygon mirror 36 is driven to rotate by a polygon driving section (not shown) so as to rotate at a predetermined angular speed in the direction of arrow Q. Thus, the light and heat sensitive recording material 12 is main-scanned in the direction indicated by the arrow M with the laser light reflected by the polygon mirror 36.

The pair of conveying rollers 27 is disposed at the conveying direction downstream side of the optical recording section 16. The light and heat sensitive recording material 12 is nipped by the pair of conveying rollers 27, conveyed along the conveying path and supplied to the heat-development section 18 which is disposed further downstream in the conveying direction. As described above, the light and heat sensitive recording material 12 is main-scanned by the laser light reflected by the polygon mirror 36. At the same time, the light and heat sensitive recording material 12 is being sub-scanned in a direction which is opposite to the conveying direction. Thus, the light and heat sensitive recording material 12 is exposed so that a latent image is recorded thereon.

The above-mentioned polygon driving section, the conveyance driving section and the modulator driving section are controlled by an exposure controller (not shown) in synchronization with the exposure. At the exposure controller, image data subjected to image processing is read out from a frame memory of an image processing device (not shown). Then, the light and heat sensitive recording material 12 is exposed on the basis of the image data that is read out.

The heat-development section 18 is formed with a far-infrared radiation heater 42 and a reflecting plate 44. The far-infrared radiation heater 42 is disposed above the conveying path and serves as a heating device for heating the exposed surface of the light and heat sensitive recording material 12. The reflecting plate 44 is provided behind the far-infrared radiation heater 42 and reflects far-infrared radiation emitted from the heater 42 toward the light and heat sensitive recording material 12. The far-infrared radiation heater 42 is controlled by a temperature controller (not shown), on the basis of data outputted from a temperature sensor (not shown) which is provided in a vicinity of the light and heat sensitive recording material 12, such that the light and heat sensitive recording material 12 is heated to a predetermined temperature. At this heat-development section 18, the light and heat sensitive recording material 12 is heated to the predetermined temperature by the far-infrared radiation heater 42, and the latent image recorded on the light and heat sensitive recording material 12 is developed.

This heating temperature is higher than the developing temperature of the light and heat sensitive recording material 12. The heating temperature is preferably in a range of 50 to 200° C. and more preferably in a range of 90 to 140° C. If the heating temperature is lower than 50° C., the light and heat sensitive recording material must have a developing temperature of less than 50° C., and the storability, before exposure, of such a light and heat sensitive recording material is significantly deteriorated. As a result, it is difficult to design such a light and heat sensitive recording material. On the other hand, if the heating temperature is higher than 200° C., the support of the light and heat sensitive recording material will be deformed by the action of heat, and dimensional stability cannot be ensured. The heating temperature is controlled such that a variation band thereof with respect to a set temperature is within ±5° C. The light and heat sensitive recording material system has a relatively wide acceptable range with respect to temperature variations and, provided that the variation band is within ±5° C., performance can be ensured.

An exhausting device 45, for removing transpired matter generated during heat-development, such as water or the like, is provided above the conveying direction downstream side of the far-infrared radiation heater 42. The exhaust device 45 sucks the transpired matter generated during heat-development, adsorbs the transpired matter with a gas adsorbing filter provided therein, and thus removes the transpired matter.

The pair of conveying rollers 46 is disposed at the conveying direction downstream side of the heat-development section 18. The light and heat sensitive recording material 12 which has been subjected to heat-development is nipped by the pair of conveying rollers 46, conveyed along the conveying path, and thereby supplied to the photo-fixing section 20 which is disposed further downstream in the conveying direction.

The photo-fixing section 20 is formed with fixing light sources 48A, 48B, 48C and 48D, which irradiate light onto an image-forming side of the light and heat sensitive recording material 12 that has been developed, a reflecting plate 49, which is provided behind the fixing light sources, and a heater 50. The fixing light sources 48A, 48B, 48C and 48D are disposed above the conveying path. At the photo-fixing section 20, light is irradiated from the fixing light sources 48A, 48B, 48C and 48D onto the light and heat sensitive recording material 12, and thus the developed image is fixed.

As the fixing light sources 48, besides white light sources, such as a fluorescent light or the like, various kinds of light sources, such as an LED, a halogen lamp, a cold cathode tube, a laser and the like, can be used. Intensity of illumination onto an irradiated portion of the light and heat sensitive recording material 12 may be in a range such that a light intensity necessary for fixing the image can be obtained and, in general, is selected in accordance with characteristics of the light and heat sensitive recording material 12. The intensity of illumination is preferably in the range of 10,000 to 50,000,000 lux·s and more preferably in the range of 20,000 to 6,000,000 lux·s. If the intensity of illumination is less than 10,000 lux·s, photo-fixing (photo-decolorization) will be insufficient. In a system which requires an intensity of illumination of more than 50,000,000 lux·s, the device will be large and costs will be high, so convenience cannot be obtained.

The heater 50 heats the light and heat sensitive recording material 12 at the same time as light irradiation from the fixing light sources 48. Because the photo-fixing/photo-decolorization is carried out while the heating is carried out, system viscosity decreases and dispersibility of active radicals increases. Due to the radical activation (the decrease in viscosity), a photopolymerization reaction and a photo-decolorization reaction accelerate, so that fixing efficiency and decolorization efficiency increase.

The heater 50 heats such that the film surface of the light and heat sensitive recording material 12 is at 30 to 200° C. Reasons why the lower limit of the temperature of the film surface of the light and heat sensitive recording material 12 is 30° C. are as follows. When the light and heat sensitive recording material 12 is heated to a temperature higher than room temperature, the radical activation increases, the photopolymerization reaction and the photo-decolorization reaction accelerate, fixation of the image increases, and the efficiency of decolorization improves. The reasons why the upper limit of the temperature of the film surface of the light and heat sensitive recording material 12 is 200° C. are to prevent deformation of the support or the like, to prevent over (heating) development fogging due to a high heating temperature, and to prevent heat-transpiration of materials being used.

The heater 50 preferably heats the light and heat sensitive recording material 12 such that the film surface thereof is 50 to 140° C. The reason why this lower limit is 50° C. is that effects of improvement due to heat are significantly exhibited at 50° C. or more. The reason why this upper limit is 140° C. is that over-development relating to heat-development characteristics in the heat-development process (variations of the development characteristics) tends not to occur below 140° C.

Moreover, the heater 50 preferably heats the light and heat sensitive recording material 12 such that the film surface thereof is 50 to 120° C. The reason why this upper limit is 120° C. is as follows. The photo-fixing characteristic/decolorization characteristic tends to be saturated when the light and heat sensitive recording material 12 is heated to around 120° C. Thus, although effects are caused by further heating, these effects are only slight. A temperature which is as low as possible, as long as problems are not presented in actual use, enables a reduction in energy consumption. Moreover, a lower temperature is preferable in view of preventing deformation of the support and the like, preventing over (heat) development fogging, and preventing heat-transpiration of the materials being used.

The pair of conveying rollers 51 is disposed at the conveying direction downstream side of the photo-fixing section 20. The photo-fixed light and heat sensitive recording material 12 is nipped by the pair of conveying rollers 51, conveyed along the conveying path and supplied to the discharge section 22 which is disposed further downstream in the conveying direction.

A discharge tray 53 is provided at the outside of the discharge opening 22A of the discharge section 22. The band-shaped light and heat sensitive recording material 12, which has been sequentially subjected to processes including exposure, development and fixing, is cut to be a print by the cutter 52 provided in the vicinity of the discharge opening 22A in the photo-fixing section 20. Then, the print is discharged from the discharge opening 22A to the discharge tray 53.

In order to maintain a high temperature of 30 to 200° C. in the photo-fixing process, heat retained from the heat-development process may be used, or photo-fixing may start in the latter half of the heat-development process. As a heating means in the photo-fixing process, in addition to the heater 50, photo-heating using the light source for photo-fixation may be used. With the above-described structure, energy consumption for heating in the photo-fixing process can be reduced. Further, the heating means in the photo-fixing process can be made more compact. As a result, the whole image-recording device can also be made more compact.

In this image-recording device, all processes of light-recording, heat-development and photo-fixing on the light and heat sensitive recording material can be carried out in one device. Moreover, in this image-recording device, development is carried out by heat-development and the developed image is fixed by photo-fixing. Thus, a processing solution is not required, and a completely dry system can be accomplished. Further, an image-receiving member or the like is not necessary, and thus waste products are not generated.

In this image-recording device, because the light and heat sensitive recording material 12 is heated while light is being irradiated thereon, the radical activation of the light and heat sensitive recording material 12 increases and the photopolymerization reaction and the photo-decolorization reaction accelerate. Thus, fixation of the image can be increased and efficiency of decolorization can also be increased. As a result, even if the fixing light sources 48 have low outputs, photo-fixing can be carried out at high speed, and the processing speed of the whole device can be increased.

(Second Embodiment)

Figure 3:
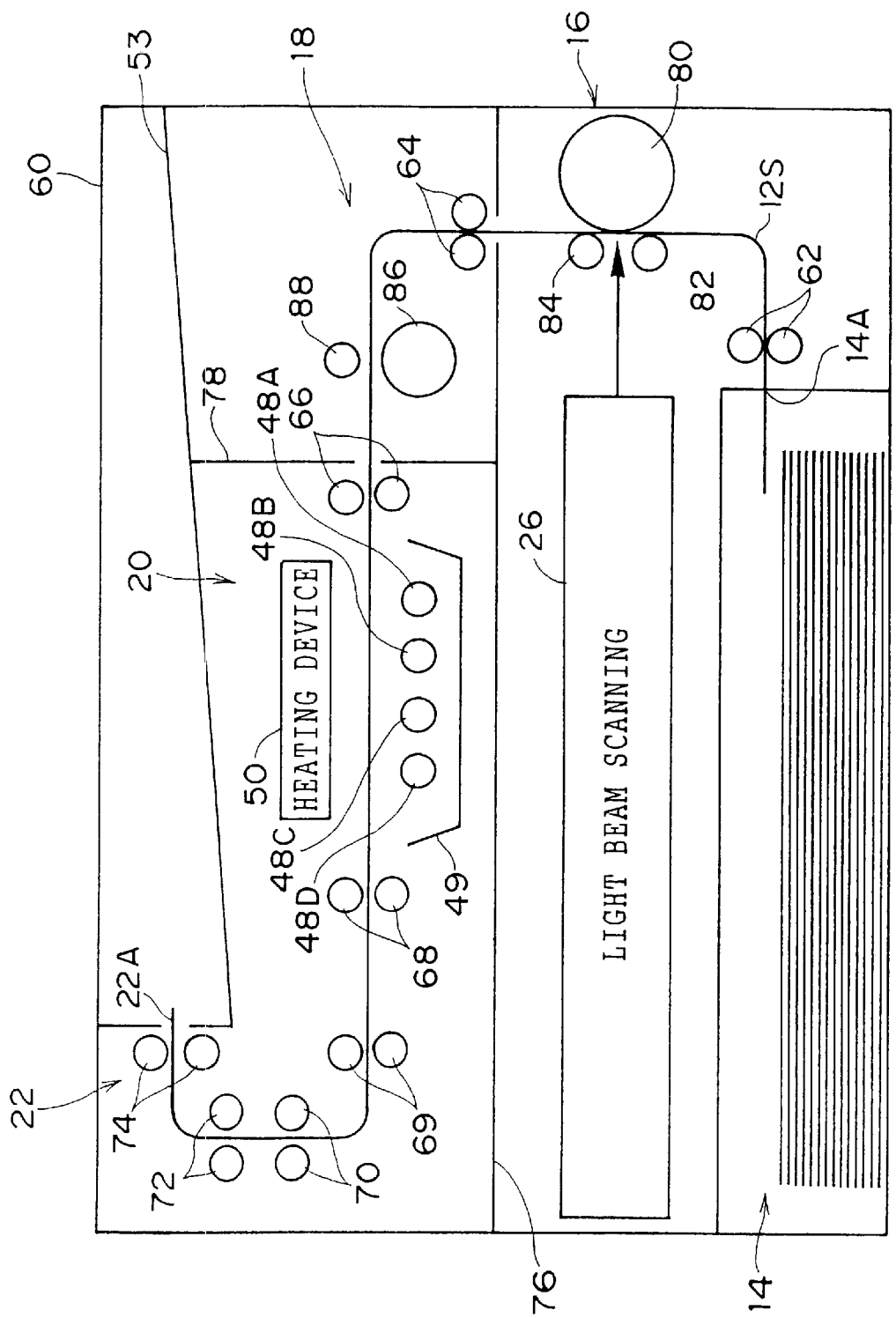
FIG. 3 is a schematic view showing the structure of an image-recording device relating to a second embodiment.

FIG. 3 shows a schematic structure of an image-recording device relating to a second embodiment, which uses a sheet-form light and heat sensitive recording material 12S. As shown in FIG. 3, provided within a housing of the image-recording device are: the cassette-type accommodating section 14 for accommodating the light and heat sensitive recording material 12S, the optical recording section 16 for exposing the light and heat sensitive recording material 12S supplied from the accommodating section 14 and recording a latent image, the heat-development section 18 for developing the latent image by heating, the photo-fixing section 20 for fixing a developed image by irradiation of light, and the discharge section 22 for discharging the light and heat sensitive recording material 12S having the image recorded thereon. The optical recording section 16 is disposed above the accommodating section 14, the heat-development section 18 and the photo-fixing section 20 are disposed above the optical recording section 16, and the discharge section 22 is disposed above the photo-fixing section 20.

Conveying roller pairs 62, 64, 66, 68, 69, 70, 72 and 74 are disposed between the respective sections. A bent conveying path for conveying the sheet-type light and heat sensitive recording material 12S in a direction from the accommodating section 14 to the discharge section 22 is formed by the conveying roller pairs 62, 64, 66, 68, 69, 70, 72 and 74. The conveying roller pairs 62, 64, 66, 68, 69, 70, 72 and 74 are connected to a conveyance driving section (not shown) and driven thereby.

The accommodating section 14 and the optical recording section 16 are separated from the other sections by a partition plate 76 which has an opening that enables the light and heat sensitive recording material 12S to pass through. The heat-development section 18 is separated from the photo-fixing section 20 by a partition plate 78 which has an opening that enables the light and heat sensitive recording material 12S to pass through. The discharge opening 22A for discharging the light and heat sensitive recording material 12S outside is provided at the discharge section 22.

A number of sheets of the light and heat sensitive recording material 12S are stacked and accommodated within the cassette type accommodating section 14, with recording layer sides of the sheets facing upward. An opening 14A for taking out the light and heat sensitive recording material 12S is formed at the accommodating section 14. The pair of conveying rollers 62 is disposed at the optical recording section 16 side of the opening 14A. The pair of conveying rollers 62 rotates with the light and heat sensitive recording material 12S being nipped thereby, and thus the light and heat sensitive recording material 12S is drawn from the accommodating section 14. The light and heat sensitive recording material 12S drawn from the accommodating section 14 is conveyed along the conveying path, which turns substantially 90° upward on its way to the optical recording section 16. As a result, the light and heat sensitive recording material 12S is supplied to the optical recording section 16 which is disposed further downstream in the conveying direction.

The optical recording section 16 is formed with the light beam scanning device 26, which is disposed adjacent to the conveying path and above the accommodating section 14, an exposure drum 80 and nip rollers 82 and 84, which are disposed so as to be able to approach and move away from the exposure drum 80. The nip rollers 82 and 84 are disposed both upstream and downstream of an exposure position of the light beam scanning device 26, so as to sandwich the exposure position. Since the light beam scanning device 26 is the same as in the first embodiment, it is denoted by the same reference numeral and further description thereof will be omitted.

The light and heat sensitive recording material 12S is held at the exposure position by the nip rollers 82 and 84 and the exposure drum 80. The light and heat sensitive recording material 12S is main-scanned by the light beam scanning device 26 and conveyed by the nip rollers 82 and 84 and the supporting drum 80. Thus, the light and heat sensitive recording material 12S is sub-scanned in a direction opposite to the conveying direction and is exposed from the recording layer side thereof. In this way, the latent image is recorded on the light and heat sensitive recording material 12S.

Wavelengths of the light source for exposure and maximum illumination amounts of light onto the surface of the light and heat sensitive recording material 12S are preferably in the same ranges as in the first embodiment.

The pair of conveying rollers 64 is disposed at the conveying direction downstream side of the optical recording section 16. The light and heat sensitive recording material 12S is nipped by the pair of conveying rollers 64 and conveyed along the conveying path, which bends substantially 90° to the left (of FIG. 3) on its way to the heat-development section 18. In this way, the light and heat sensitive recording material 12S is supplied to the heat-development section 18 which is disposed further downstream in the conveying direction.

The heat-development section 18 is formed with a heating drum 86 that serves as a heating device, which is disposed below the conveying path and heats the exposed surface of the light and heat sensitive recording material 12S, and a pressing roller 88, which is disposed so as to face the heating drum 86 with the light and heat sensitive recording material 12S interposing therebetween. A heat source such as a halogen lamp or the like is provided within the heating drum 86. The heating drum 86 is controlled by a temperature controller (not shown), on the basis of data outputted from a temperature sensor (not shown) provided in the vicinity of the light and heat sensitive recording material 12S, such that the light and heat sensitive recording material 12S is heated to a predetermined temperature. At the heat-development section 18, the light and heat sensitive recording material 12S is heated to the predetermined temperature, and the latent image recorded on the light and heat sensitive recording material 12S is developed. The heating temperature is preferably in the same range as in the first embodiment.

The pair of conveying rollers 66 is disposed at a conveying direction downstream side of the heat-development section 18. The light and heat sensitive recording material 12S, which has been subjected to heat-development, is nipped by the pair of conveying rollers 66, conveyed along the conveying path, toward the left in FIG. 3, and supplied to the photo-fixing section 20 which is disposed further downstream in the conveying direction.

The photo-fixing section 20 includes the fixing light sources 48A, 48B, 48C and 48D, which irradiate light onto the image-forming side of the developed light and heat sensitive recording material 12S, the reflecting plate 49, which is disposed behind the fixing light sources 48, and the heater 50. The fixing light sources 48A, 48B, 48C and 48D are disposed below the conveying path. At the photo-fixing section 20, lights are irradiated from the fixing light sources 48A, 48B, 48C and 48D onto the light and heat sensitive recording material 12S, and the developed image is fixed. The same light sources as in the first embodiment can be used as the fixing light sources 48. The intensity of illumination of the fixing light sources 48 is also the same as in the first embodiment. The heating temperature of the heater 50 is the same as in the first embodiment.

The conveying roller pairs 68, 69, 70, 72 and 74 are disposed, in that order, at a conveying direction downstream side of the photo-fixing section 20. The photo-fixed light and heat sensitive recording material 12S is nipped by the conveying roller pairs 68, 69, 70, 72 and 74. The light and heat sensitive recording material 12S is conveyed along the conveying path, which bends substantially 90° upward between the conveying roller pairs 69 and 70 and bends substantially 90° to the right (of FIG. 3) between the conveying roller pairs 72 and 74. In this way, the light and heat sensitive recording material 12S is supplied to the discharge section which is disposed further downstream in the conveying direction.

The discharge tray 53 is provided at the outside of the discharge opening 22A of the discharge section 22. The light and heat sensitive recording material 12S, which has been sequentially subjected to exposure, development and fixation, is discharged from the discharge opening 22A to the discharge tray 53.

In the image-recording device relating to the second embodiment, all processes to be carried out on the light and heat sensitive recording material, including optical recording, heat-development and photo-fixing, can be carried out within one device. Further, in the image-recording device of the second embodiment, because development is carried out by heat-development and the developed image is fixed by photo-fixing, a processing solution is not necessary and a completely dry system can be accomplished. Moreover, an image-receiving member or the like is not required, so waste products are not generated. Further, the accommodating section, the optical recording section, the heat-development section and the photo-fixing section are vertically arranged and the conveying path is bent. Thus, the device can be made more compact.

In the first and second embodiments, a light beam scanning device which has a laser light source is used at the optical recording section. An amount of light from a lamp, an LED or the like can be adjusted, and the adjusted light can be irradiated. An image which is projected by a lamp or the like may be exposed. Further, the exposure may be carried out in a close-contacting manner.

In the first and second embodiments, the light sources for fixing are provided separately from the light source for recording of the optical recording section. Photo-fixing may be carried out by scanning and exposing with light whose wavelength is the same as that of the light for recording, using the light beam scanning device that includes the laser light source of the optical recording section.

In the first embodiment, the far-infrared radiation heater is used as the heating device, and in the second embodiment, the heating drum and the pressing roller are used as the heating device. Various kinds of heating devices, as shown in FIGS. 4 to 12, may be used. The light and heat sensitive recording material 12 is heated from a front surface side thereof, but the light and heat sensitive recording material may be heated from a back surface side thereof.

Figure 4:
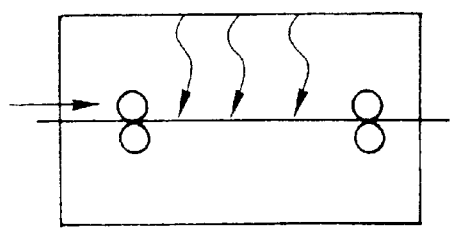
FIG. 4 is a schematic view showing another structural example of a heating device.
Figure 5:
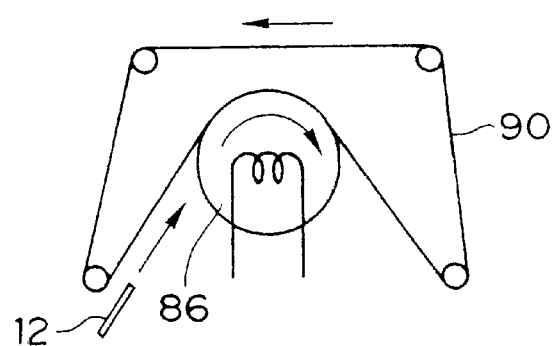
FIG. 5 is a schematic view showing another structural example of the heating device.
Figure 6:
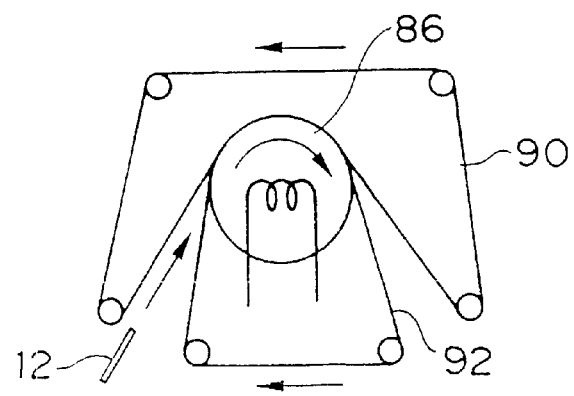
FIG. 6 is a schematic view showing another structural example of the heating devise.

A heating device shown in FIG. 4 is for heat-developing by blowing a warm air current. In a heating device shown in FIG. 5, the light and heat sensitive recording material 12 is pressed to a heating drum 86 by a pressing belt 90, which serves as a pressing member, such that heat-development can be carried out. At a heating device shown in FIG. 6, a belt 92 is entrained about the heating drum 86, which has a heat source therein, while being pulled taut, and the light and heat sensitive recording material 12 is pressed to the belt 92 by a pressing belt 90, such that heat-development can be carried out.

Figure 7:
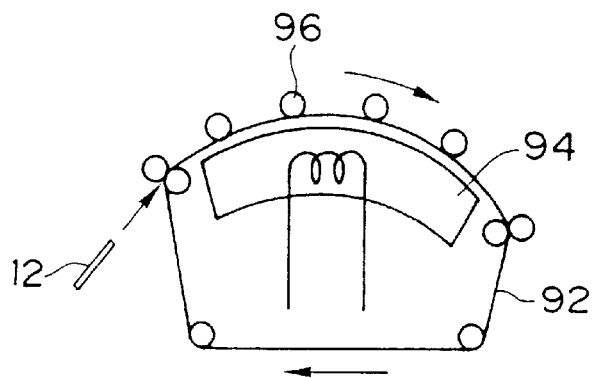
FIG. 7 is a schematic view showing another structural example of the heating device.
Figure 8:
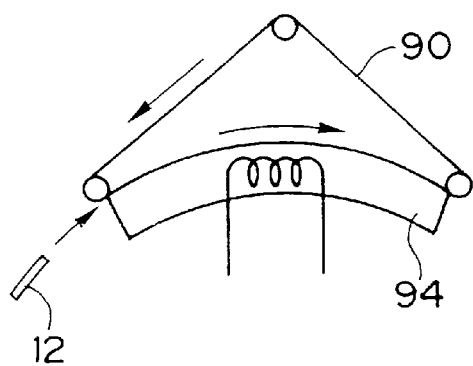
FIG. 8 is a schematic view showing another structural example of the heating device.

In a heating device shown in FIG. 7, the belt 92 is entrained about a convex plate heater 94 while being pulled taut, and the light and heat sensitive recording material 12 is pressed to the belt 92 by a plurality of pressing rollers 96, such that heat-development can be carried out. A heating device shown in FIG. 8 can carry out heat-development with the light and heat sensitive recording material 12 pressed to the convex plate heater 94 by the pressing belt 90, which serves as a pressing member.

Figure 9:
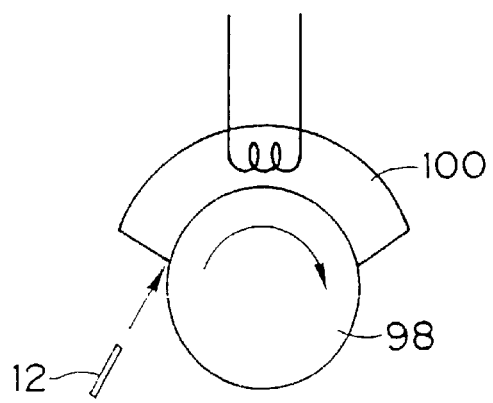
FIG. 9 is a schematic view showing another structural example of the heating device.
Figure 10:
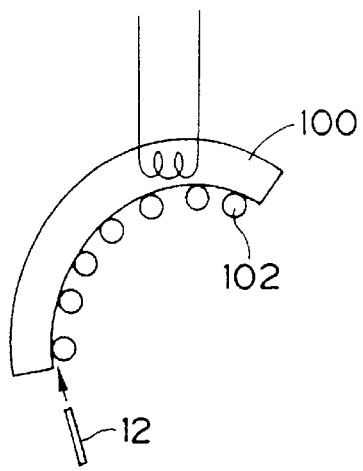
FIG. 10 is a schematic view showing another structural example of the heating device.

In a heating device shown in FIG. 9, a concave plate heater 100 is provided along the circumference of a drum 98. The light and heat sensitive recording material 12 is pressed to the concave plate heater 100 by the drum 98, and heat-development can be carried out. In a heating device shown in FIG. 10, a plurality of pressing rollers 102, which serve as pressing members, are arranged at the inner circumference side of the concave plate heater 100. The light and heat sensitive recording material 12 is pressed to the concave plate heater 100 by the pressing rollers 102 such that heat-development can be carried out.

Figure 11:
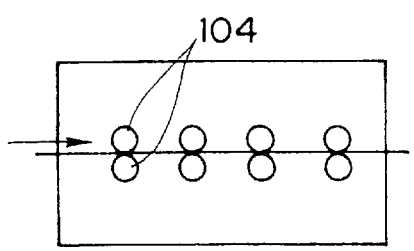
FIG. 11 is a schematic view showing another structural example of the heating device.
Figure 12:
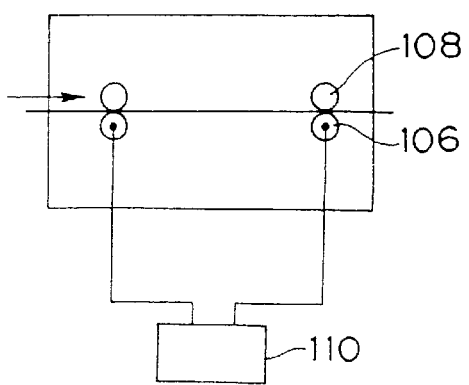
FIG. 12 is a schematic view showing another structural example of the heating device.

In a heating device shown in FIG. 11, a plurality of heating roller pairs 104, each of which is internally equipped with a heat source, are arranged along the conveying path. The light and heat sensitive recording material 12 is nipped by the heating roller pairs 104, such that heat-development can be carried out. In a heating device shown in FIG. 12, heating rollers 106, which generate heat by being energized directly from an externally provided power source, are used. A plurality of roller pairs, each of which is formed by one of the heating rollers 106 and one of press rollers 108, are arranged along the conveying path. Thus, the light and heat sensitive recording material 12 is nipped by the heating rollers 106 and the pressing rollers 108, such that heat-development can be carried out.

(Light and Heat Sensitive Recording Material)

Next, a light and heat sensitive recording material, which is used for image-recording in the image-recording device of the present invention, will be described. The light and heat sensitive recording material used in the present invention has a photosensitive thermal layer (an image-recording layer) on a support. At this photosensitive thermal layer, a latent image is formed by exposure. The latent image is developed by being heated, so that an image is formed. In the light and heat sensitive recording material used in the present invention, other than the light and heat sensitive recording layer, conventionally known other layers such as a protection layer, an intermediate layer, a UV absorbing layer and the like may be formed at any position. The light and heat sensitive recording material used in the present invention has, on the support, at least three light and heat sensitive recording layers, which include a yellow color-forming component, a magenta color-forming component and a cyan color-forming component, respectively. Thus, the material can be used for color image formation as a color light and heat sensitive recording material. This color light and heat sensitive recording material may include a light and heat sensitive recording layer that includes a black color-forming component, if required.

In the present invention, a light and heat sensitive recording material which includes a light and heat sensitive recording layer (a), (b), (c) or (d) can be appropriately used. These light and heat sensitive recording layers (a), (b), (c) and (d) are as follows. A photosensitive thermal layer (a) contains 1) thermally-responsive microcapsules which encapsulate a color-forming component A and, outside the microcapsules, 2) a photo-polymerizable composition which contains at least i) a compound B which is substantially colorless and has, within the same molecule, a polymerizable group and a site which reacts with the color-forming component A to form color, and ii) a photo-polymerization initiator. A light and heat sensitive recording layer (b) contains 1) thermally-responsive microcapsules which encapsulate a color-forming component A and, outside the microcapsules, 2) a photo-polymerizable composition which contains at least i) a substantially colorless compound C which reacts with the color-forming component A to form color, ii) a photo-polymerizable compound D and iii) a photo-polymerization initiator. A light and heat sensitive recording layer (c) contains 1) thermally-responsive microcapsules which encapsulate a color-forming component A and, outside the microcapsules, 2) a photo-polymerizable composition which includes at least i) a substantially colorless compound C which reacts with the color-forming component A to form color, ii) a photo-polymerizable compound Dp which has a site that suppresses the reaction of the color-forming component A with the compound C, and iii) a photo-polymerization initiator. A light and heat sensitive recording layer (d) contains 1) thermally-responsive microcapsules which encapsulate a substantially colorless compound C which reacts with a color-forming component A to form color and, outside the microcapsules, 2) a photo-polymerizable composition which contains at least i) the color-forming component A, ii) a photo-polymerizable compound D and iii) a photo-polymerization initiator.

In the light and heat sensitive recording layer (a), by carrying o u t exposure of a desired image shape, the photo-polymerizable composition outside the microcapsules polymerizes and is cured by radicals generated from the photo-polymerization initiator so that a latent image of the desired image shape is formed. Then, due to heating, the compound B present in an unexposed portion moves within the recording material, and reacts with the color-forming component A within the capsules, thereby forming color. Accordingly, the above-described light and heat sensitive recording layer (a) is a positive light and heat sensitive recording layer in which colors are not formed at an exposed portion, and uncured portions in the unexposed portion form color so that an image is formed. Specific examples thereof include a light and heat sensitive recording layer disclosed in Japanese Patent Application Laid-Open (JP-A) No. 3-87827, which contains, outside microcapsules, a photo-curable composition that contains a compound having, within the same molecule, an electron accepting group and a polymerizable group and that has a photo-polymerization initiator, and which includes an electron donating colorless dye which is encapsulated in the microcapsules. In this light and heat sensitive recording layer, by carrying out exposure, the photo-curable composition present outside the microcapsules polymerizes and is cured so that a latent image is formed. Thereafter, due to heating, the electron accepting compound present in unexposed portions moves within the recording material and reacts with the electron donating colorless dye within the microcapsules so as to form color.

Accordingly, the cured latent image portions in the exposed portions do not form color and only the uncured portions form color, so that a sharp positive image having high contrast can be formed.

In the above-described light and heat sensitive recording layer (b), by effecting exposure to the desired image shape, the photo-polymerizable compound D is polymerized by radicals generated from the photo-polymerization initiator, which begins a reaction when exposed, and the film is cured so that a latent image of the desired image shape is formed. Because the photo-polymerizable compound D does not have a site for suppressing the reaction of the color-forming component A with the compound C, the compound C present in the unexposed portion moves within the recording material due to heating, and reacts with the color-forming component A within the capsules so as to form color. Thus, the above-described light and heat sensitive recording layer (b) is a positive light and heat sensitive recording layer in which color is not formed at the exposed portions and color is formed at the uncured portions in the unexposed portion, so that an image is formed. Specific examples of such a light and heat sensitive recording layer include a light and heat sensitive recording layer which contains an azomethine dye precursor encapsulated in microcapsules, a deprotective agent which generates an azomethine dye from the dye precursor, a photo-polymerizable compound and a photo-polymerization initiator. In this light and heat sensitive recording layer, by effecting exposure, the photo-polymerizable compound outside the microcapsules is polymerized and cured, and a latent image is formed. Then, the deprotective agent present in the unexposed portion is moved within the recording material by heating, and reacts with the azomethine dye precursor within the microcapsules so as to form color. Accordingly, the cured latent image portion of the exposed portion does not form color and only the uncured portions form color, so that a positive image can be formed.

In the light and heat sensitive recording layer (c), by carrying out exposure to the desired image shape, the photo-polymerizable compound Dp is polymerized by radicals generated from the photo-polymerization initiator, which begins a reaction when exposed, and the film is cured so that a latent image of the desired image shape is formed. Since the photo-polymerizable compound Dp has a site for suppressing the reaction of the color-forming component A with the compound C, the compound C moves depending on the film characteristic of the latent image (the cured portion) formed by exposure, and reacts with the color-forming component A in the capsules to form the image. Thus, the above-described light and heat sensitive recording layer (c) is a negative light and heat sensitive recording layer, in which the exposed portion forms color so that an image is formed. Specific examples of such a light and heat sensitive recording layer include a light and heat sensitive recording layer disclosed in JP-A No. 4-211252 which contains, outside microcapsules, an electron accepting compound, a polymerizable vinyl monomer and a photo-polymerization initiator and, encapsulated in the microcapsules, an electron donating colorless dye. The mechanism for image formation in this light and heat sensitive recording layer is unclear but is thought to be as follows. The vinyl monomer which exists outside the microcapsules is polymerized by exposure. Meanwhile, the electron accepting compound present at the exposed portion is not included in the formed polymer at all. Instead, the interaction of the electron accepting compound with the vinyl monomer decreases, so that the electron accepting compound exists in a movable state with high diffusion speed. The electron accepting compound in the unexposed portion is trapped by the vinyl monomer in the unexposed portion. Thus, under heating, the electron accepting compound in the exposed portion moves preferentially within the recording material, and reacts with the electron donating colorless dye within the microcapsules. The electron accepting compound in the unexposed portion cannot penetrate the capsule walls, even when heated, and does not react with the electron donating colorless dye, so cannot contribute to color formation. Accordingly, in the light and heat sensitive recording layer, since the image is formed such that the exposed portion thereof forms color and the unexposed portion thereof does not form color, a sharp negative image with high contrast can be formed.

In the above-described light and heat sensitive recording layer (d), by carrying out exposure to the desired image shape, the photo-polymerizable compound D is polymerized by radicals generated from the photo-polymerization initiator, which begins reaction due to exposure, and the film is cured, so that a latent image of the desired image shape is formed. Since the photo-polymerizable compound D does not have a site for suppressing the reaction of the color-forming component A with the compound C, the color-forming component A present at the unexposed portion moves within the recording material when heated, and reacts with the compound C within the capsules so as to form color. Accordingly, the above-described light and heat sensitive recording layer (d) is a positive light and heat sensitive recording layer in which color is not formed at the exposed portion and color is formed at the uncured portions of the unexposed portion, so that an image is formed.

Components which form the above-described light and heat sensitive recording layers (a) through (d) will be described in detail hereinafter. As the color-forming component A in the light and heat sensitive recording layers (a) through (d), a substantially colorless electron donating colorless dye or a diazonium salt compound may be used.

Conventionally known electron donating colorless dyes may be used, and any dye may be used provided it reacts with the compound B or the compound C to form color. Specific examples of these color-forming components include the compounds disclosed in Japanese Patent Application No. 11-36308. Examples of the electron donating compound are disclosed from paragraph [0051] to paragraph [0059] in Japanese Patent Application No. 11-36308. Electron donating colorless dyes for cyan, magenta and yellow color-forming dyes which can be used in combination with the electron donating compound when the light and heat sensitive recording material is used as a full color recording material in the present invention are disclosed in paragraph [0060] of Japanese Patent Application No. 11-36308. The above-described electron donating colorless dye is preferably used in the range of 0.1 to 1 $g/m^2$ and more preferably in the range of 0.1 to 0.5 $g/m^2$. If the amount of the electron donating colorless dye to be used is less than 0.1 $g/m^2$, there may be a case in which color density cannot be sufficiently obtained. If the amount exceeds 1 $g/m^2$, a coating characteristic may deteriorate, which is not preferable.

Examples of the diazonium salt compound include compounds represented by the following formula, $$Ar_1-N_2+X-$$

in which $Ar_1$ represents an aromatic ring and X-represents an acid anion.

The diazonium salt compound is a compound that causes a coupling reaction with the coupler when heated, so as to form color, and which is decomposed by light. The wavelength of maximum absorption of the diazonium salt compound can be controlled by varying positions and kinds of substituents at the Arl portion thereof. In the present invention, the wavelength of maximum absorption λ max of the diazonium salt compound is preferably 450 nm or less, and more preferably 290 to 440 nm, in view of the effects of the present invention. Further, in the present invention, the diazonium salt compound preferably has at least 12 carbon atoms, solubility in water of 1% or less, and solubility in ethyl acetate of 5% or more. Specific examples of the diazonium salt compound which can be appropriately used include, but are not limited to, the compounds disclosed from paragraph [0064] to paragraph [0075] in Japanese Patent Application No. 11-36308.

The diazonium salt compound may be used alone or in a combination of two or more kinds, in accordance with purposes such as hue adjustment and the like. The amount of the diazonium salt compound used in the light and heat sensitive recording layer is preferably 0.01 to 3 g/m² and more preferably 0.02 to 1.0 g/m². If the amount of the diazonium salt compound is less than 0.01 g/m², sufficient color-forming ability cannot be obtained. An amount exceeding 3 g/m² is not preferable because sensitivity may decrease and a long fixing time may be required.

The substantially colorless compound B, which is used in the photosensitive thermal transfer layer (a) and has, within the same molecule, a polymerizable group and a site which reacts with the color-forming component A to form color, may be any compounds that reacts with the color-forming component A to form color, such as an electron accepting compound having a polymerizable group or a coupler compound having a polymerizable group or the like, and that reacts under light to be polymerized and cured.

The electron accepting compound having a polymerizable group, i.e., a compound having an electron accepting group and a polymerizable group in the same molecule, may be any compound that has a polymerizable group, reacts with the electron donating colorless dye, which is one form of the color-forming component A, to form color, and is able to cure the film by photopolymerization.

Examples of the electron accepting compound having a polymerizable group are compounds which are able to be synthesized with reference to the following compounds: 3-halo-4-hydroxybenzoic acid, disclosed in JP-A No. 4-226455; methacryloxyethylesters and acryloxyethylesters of benzoic acid having a hydroxy group, disclosed in JP-A No. 63-173682; esters of benzoic acid having a hydroxy group and hydroxymethylstyrene, disclosed in JP-A Nos. 59-83693, 60-141587 and 62-99190; hydroxystyrenes, disclosed in European Patent No. 29323; N-vinyl imidazole complexes of zinc halide, disclosed in JP-A Nos. 62-167077 and 62-16708; an electron accepting compound disclosed in JP-A No. 63-317558; and the like.

Among these compounds having an electron accepting group which reacts with the electron donating colorless dye and a polymerizable group in the same molecule, 3-halo-4-hydroxybenzoic acids represented by the following general formula, which are electron accepting compounds having a polymerizable group are preferable:

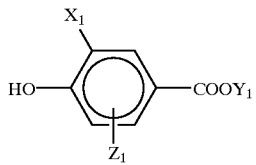

in which $X_1$ represents a halogen atom, preferably a chlorine atom. $Y_1$ represents a monovalent group having a polymerizable ethylene group. An aralkyl group having a vinyl group, an acryloyloxyalkyl group having a vinyl group, or a methacryloylalkyl group having a vinyl group is preferable. An acryloyloxyalkyl group having, 5 to 11 carbon atoms or a meth-acryloyloxyalkyl group having 6 to 12 carbon atoms is more preferable. $Z_1$ represents a hydrogen atom, an alkyl group or an alkoxy group.

Specific examples of the electron accepting compound having a polymerizable group include compounds disclosed from paragraph [0082] to paragraph [0087] in Japanese Patent Application No. 11-36308.

The electron accepting compound having a polymerizable group is used in combination with the electron donating colorless dye. In this case, the electron accepting compound is used in the range of 0.5 to 20 parts by weight, and more preferably in the range of 3 to 10 parts by weight, per one part by weight of the electron donating colorless dye to be used. If the amount of the electron accepting compound is less than 0.5 parts by weight, sufficient color-forming density cannot be obtained. An amount of the electron accepting compound exceeding 20 parts by weight is not preferable because sensitivity may decrease and the coating characteristic may deteriorate.

If the electron donating colorless dye and the electron accepting compound are used as color-forming components, in order to obtain a predetermined maximum coloring density, a method of selecting the kinds of the electron donating colorless dye and the electron accepting compound or a method of adjusting a coating amount of the formed recording layer may be utilized.

The coupler compound having a polymerizable group used in the photosensitive thermal transfer layer (a) may be any compound that has a polymerizable compound, reacts with the diazonium salt compound, which is one form of the color-forming component A, to form color, and can cure the film by photopolymerization. The coupler compound is coupled to a diazo compound under a basic atmosphere and/or a neutral atmosphere to form a dye. A plurality of kinds of coupler compound may be used in accordance with various purposes such as hue adjustment and the like. Specific examples of the coupler compound include, but are not limited to, compounds disclosed from paragraph [0090] to paragraph [0096] in Japanese Patent Application No. 11-36308. The coupler compound may be added to the light and heat sensitive recording layer (a) in the range of 0.02 to 5 g/m² and more preferably in the range of 0.1 to 4 g/m² in view of effects. An added amount of less than 0.02 g/m² is not preferable because the color-forming ability deteriorates, and an added amount exceeding 5 g/m² is not preferable because the coating characteristic deteriorates.

The coupler compound is used in combination with the diazonium salt compound. In this case, the coupler compound is preferably used in the range of 0.5 to 20 parts by weight and more preferably in the range of 1 to 10 parts by weight per one part by weight of the diazonium salt compound. If the amount of the coupler compound is less than 0.5 parts by weight, sufficient color-forming ability cannot be obtained. An amount of the coupler compound exceeding 20 parts by weight is not preferable because the coating characteristic deteriorates. The coupler compound may be employed by adding a water-soluble polymer together with other components and solid-dispersing with a sand mill or the like. Also, the coupler compound may be used as an emulsion by being emulsified together with an appropriate emulsion aid. Here, the method of solid-dispersing or emulsifying is not especially limited and conventional known methods may be used. Details of such methods are disclosed in JP-A Nos. 59-190886, 2-141279 and 7-17145.

In the light and heat sensitive recording layer (a), in order to accelerate the coupling reaction, organic bases such as tertiary amines, piperidines, piperazines, amidines, formamidines, pyridines, guanidines, morpholines and the like are preferably used. Specifically, these organic bases are disclosed in JP-A Nos. 57-123086, 60-49991, 60-94381, 9-71048, 9-77729, and 9-77737 and the like. The amount of the organic base used is not especially limited, but is preferably 1 to 30 mol per one mol of the diazonium salt compound.

Moreover, in order to accelerate the color-forming reaction, a color-forming aid may be added to the light and heat sensitive recording layer (a). Examples of the color-forming aid include phenol derivatives, naphthol derivatives, alkoxy-substituted benzenes, alkoxy-substituted naphthalenes, hydroxy compounds, amide carboxylate compounds, sulfonamide compounds and the like. These compounds have functions of decreasing the melting point of the coupler compound or the basic substance, or of enhancing the thermal-permeability of the microcapsule wall, and thus are considered to be compounds by which high color-forming density can be obtained.

In the light and heat sensitive recording layers (b) through (d), as the compound which reacts with the color-forming component A to form color, instead of the compound B, which has a polymerizable group, the substantially colorless compound C, which does not have a polymerizable group and which reacts with the color-forming component A to form color, may be used. Here, as the compound C does not have a polymerizable group, in order to have the recording layer cure by photopolymerization, the photo-polymerizable compound D having a polymerizable group is used.

As the compound C, any electron accepting compound or coupler compound which does not have a polymerizable group may be used. Any electron accepting compound which does not have a polymerizable group may be used that can react with the electron donating colorless dye, which is one form of the color-forming component A, to form color.

Examples of the electron accepting compound which does not have a polymerizable group include phenol derivatives, salycylic acid derivatives, metal salts of aromatic carboxylic acid, acid clay, bentonite, novolak resin, metal-treated novolak resin, metal complexes, and the like. Specific examples of the electron accepting compound which does not have a polymerizable group are disclosed in Japanese Patent Application Publication (JP-B) Nos. 40-9309 and 45-14039, JP-A Nos. 52-140483, 48-51510, 57-210886, 58-87089, 59-11286, 60-176795 and 61-95988, and the like. Other specific examples of the electron accepting compound which does not have a polymerizable group are disclosed from paragraph [0109] to paragraph [0110] in Japanese Patent Application No. 11-36308 and the like. The amount of the electron accepting compound which does not have a polymerizable group to be used is preferably 5 to 1,000% by weight based on the amount of the electron donating colorless dye to be used.

Any coupler compound which does not have a polymerizable group may be used that reacts with the diazonium salt compound, which is one type of the color-forming component A, so as to form color. The coupler compound which does not have a polymerizable group is a compound which couples to the diazonium salt compound under a basic atmosphere and/or a neutral atmosphere to form a dye. A plurality of kinds of coupler compound can be used in combination, in accordance with various purposes such as hue adjustment and the like. Examples of the coupler compound which does not have a polymerizable group include so-called active methylene compounds, which have a methylene group adjacent to a carbonyl group, phenol derivatives, naphthol derivatives and the like, and can be appropriately selected and used.

Specific examples of the coupler compound which does not have a polymerizable group include compounds disclosed from paragraph [0119] to paragraph [0121] in Japanese Patent Application No. 11-36308. Coupler compounds which do not have a polymerizable group are disclosed in JP-A Nos. 4-201483, 7-223367, 7-223368, 7-323660, 5-278608, 5-297024, 6-18669, 6-18670 and 7-316280, and the like. Reference can also be made to Japanese Patent Application Nos. 8-12610 and 8-30799, JP-A Nos. 9-216468, 9-216469, 9-319025, 10-35113, 10-19380 and 10-264532, which have been previously filed by the present applicant.

The coupler compound which does not have a polymerizable group is added to the light and heat sensitive recording layer (b), as in the case of the coupler compound which has a polymerizable group, in the range of 0.02 to 5 $g/m^2$ and more preferably in the range of 0.1 to 4 $g/m^2$ in view of effects. If the added amount is less than 0.02 $g/m^2$, sufficient color-forming density cannot be obtained. An added amount exceeding 5 $g/m^2$ is not preferable because the coating characteristic deteriorates. The coupler compound may be employed by adding a water-soluble polymer together with other components and solid-dispersing with a sand mill or the like. Also, the coupler compound may be used in an emulsion by being emulsified together with an appropriate emulsion aid. The method of solid-dispersing or emulsifying is not especially limited and conventional known methods may be used. Details of such methods are disclosed in JP-A Nos. 59-190886, 2-141279 and 7-17145.

In order to accelerate the coupling reaction in the light and heat sensitive recording layers (b) through (d), organic bases such as tertiary amines, piperidines, piperazines, amidines, formamidines, pyridines, guanidines, morpholines and the like are preferably used. The organic bases used here are the same bases as those used in the case of the coupler compound having a polymerizable group. The amount of the organic base to be used is also the same. With regard to color-forming aids, which are used in order to accelerate the color-forming reaction, the same ones as those in the case of the coupler compound having a polymerizable group can be used.

As the photo-polymerizable compound D, a photo-polymerizable monomer can be used. A photo-polymerizable monomer which has at least one vinyl group within a molecule may be used. In order to obtain a negative image, the photo-polymerizable compound Dp, which has a site for suppressing the reaction of the color-forming component A with the compound C, may be used as the photo-polymerizable compound. An appropriate photo-polymerizable compound Dp, i.e., a specific photo-polymerizable monomer (Dp1 or Dp2), is selected and used in accordance with the compound C to be used.

If the electron accepting compound which does not have a polymerizable group is used, the specific photo-polymerizable monomer Dp1 is used. The photo-polymerizable monomer Dp1 is preferably a photo-polymerizable monomer which has a reaction-inhibiting function for inhibiting the reaction between the electron donating colorless dye and the electron accepting compound and has at least one vinyl group within the molecule thereof.

Specific examples of the photo-polymerizable monomer include acrylic acid and salts thereof, acrylates, acrylamides; methacrylic acid and salts thereof, methacrylates, methacrylamides; anhydrous maleic acid, maleates; itaconic acid, itaconates; styrenes; vinyl ethers; vinyl esters; N-vinyl heterocyclic rings; arylethers; allylesters and the like. Among the aforementioned monomers, in particular, a photo-polymerizable monomer having a plurality of vinyl groups within the molecule is preferably used. Examples of such a photo-polymerizable monomer include acrylic esters and methacrylic esters of polyhydric alcohols such as trimethylolpropane and pentaerythritol and the like; acrylic esters and methacrylic esters of polyhydric phenols and bisphenols such as resorcinol, pyrogallol, phloroglucinol and the like; and acrylate-terminated or methacrylate-terminated epoxy resins, acrylate-terminated or methacrylate-terminated polyesters and the like. Among the aforementioned monomers, ethylene glycol diacrylate, ethylene glycol dimethacrylate, trimethylolpropane triacrylate, pentaerythritol tetraacrylate, dipentaerythritol hydroxypentaacrylate, hexanediol-1,6-dimethacrylate and diethylene glycol dimethacrylate and the like are especially preferable.

The molecular weight of the photo-polymerizable monomer Dp1 is preferably about 100 to about 5,000 and more preferably about 300 to about 2,000. The photo-polymerizable monomer Dp1 is used preferably in the range of 0.1 to 10 parts by weight and more preferably in the range of 0.5 to 5 parts by weight per one part of the substantially colorless compound C which reacts with the color-forming component A to form color. If the amount of the monomer is less than 0.1 parts by weight, a latent image cannot be formed in the exposure process, and an amount of the monomer exceeding 10 parts by weight is not preferable because the color-forming density will decrease.

When the coupler compound which does not have a polymerizable group is used, the specific photo-polymerizable monomer Dp2 is used in combination therewith. The photo-polymerizable monomer Dp2 is preferably a photo-polymerizable monomer which has an acid group that has an inhibitory effect on the coupling reaction, and which is not a metallic salt compound. Examples of the photo-polymerizable monomer Dp2 include monomers disclosed from paragraph [0128] to paragraph [0130] in Japanese Patent Application No. 11-36308. The photo-polymerizable monomer Dp2 is used preferably in the range of 0.1 to 10 parts by weight and more preferably in the range of 0.5 to 5 parts by weights per one part by weight of the substantially colorless compound C which reacts with the color-forming component A to form color. If the amount of the monomer Dp2 is less than 0.1 parts by weight, a latent image cannot be formed in the exposure process and an amount of the monomer exceeding 10 parts by weight is not preferable because the color-forming density will decrease.

In the light and heat sensitive recording layers (b) through (d), an azomethine dye precursor may be used as the color-forming component A, and, as the compound C, a deprotective agent which generates an azomethine dye (thereby forming color) by contact with the azomethine dye precursor may be used. By using, as the photo-polymerizable compound, the photo-polymerizable compound (Dp) which has a site for suppressing the reaction of the azomethine dye precursor with the deprotective agent, a negative image can be obtained.

As the azomethine dye precursor, a compound represented by the following general formula (1) may be used:

General formula (1)

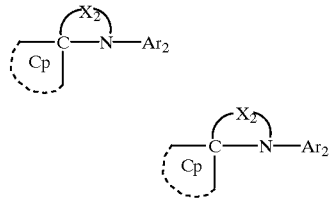

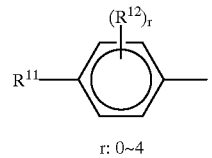

in which $Ar_2$ represents an aromatic ring group or a heterocyclic ring group which may have a substituent, and $X_2$ represents a bivalent connecting group. Cp represents a coupler residue which may form a ring.

Examples of the aromatic ring group, which may have a substituent, represented by $Ar_2$ include groups represented by the following structural formula (3), Structural formula (3)

$$R^{11}\!\!-\!\!\bigodot\!\!-\!\!(R^{12})_r$$

r: 0~4 r=0 to 4 in which $R^{11}$ represents a hydrogen atom, an alkyl group, an aryl group, a halogen atom, a cyano group, a nitro group, $SO_3H$, a heterocyclic ring group, $NR^{13}R^{14}$, $OR^{15}$, $CO_2H$, $SR^{15}$, $COR^{16}$, $CO_2R^{16}$, $SO_2R^6$, $SOR^{16}$, $CONR^{17}R^{18}$ or $SO_2NR^{17}R^{18}$. $R^{12}$ represents the same groups as $R^{11}$. $R^{11}$ and $R^{12}$ may bind to form a ring. If $R^{11}$ or $R^{12}$ represents a group having a dissociating proton, a salt may be formed. $R^{13}$ and $R^{14}$ represent a hydrogen atom, an alkyl group, an aryl group or a heterocyclic ring group. $R^{15}$ represents a hydrogen atom, $COR^{16}$, $CO_2R^{16}$, $SO_2R^{16}$, $CONR^{17}R^{18}$, an alkyl group or an aryl group. $R^{16}$ represents a hydrogen atom, an alkyl group, an aryl group or a heterocyclic ring group. $R^{17}$ and $R^{18}$ represent a hydrogen atom, an alkyl group, an aryl group or a heterocyclic ring group. r represents an integer of 0 to 4.

Examples of the heterocyclic ring group which may have substituents and which is represented by $Ar_2$ in general formula (1) include pyridine, pyrimidine, triazine, pyridazine, pyrazine, furan, thiophene, pyrrole, pyrazole, triazole, isoxyazole, isothiazole, imidazole, oxazole, thiazole and tetrazole. Examples of the substituents include the groups mentioned for $R^{11}$ and $R^{12}$.

In general formula (1), alkyl groups, aryl groups and heterocyclic ring groups represented by $R^{11}$ to $R^{18}$ may have further substituents. Examples of such substituents include an alkyl group, an aryl group, a hydroxy group, a nitro group, a cyano group, a halogen group, an alkylsulfonyl group, an arylsulfonyl group, an alkoxycarbonyl group, an aryloxycarbonyl group, an acyl group, an amino group, an alkylamino group, a dialkylamino group, an acylamino group, an alkylsulfonylamino group, an arylsulfonylamino group, a carbamoyl group, a sulfamoyl group, an alkylthio group, an arylthio group, a heterocyclic ring group, an arylamino group, a diarylamino group, an arylalkylamino group, an alkoxy group, and an aryloxy group. $Ar_2$ may bind to an aromatic ring or a heterocyclic ring. An alkyl group contained in $Ar_2$ may be a saturated, unsaturated or cyclic group.

Cp in general formula (1) represents a coupler residue. Any conventional known couplers used for silver photography or diazo heat-sensitive recording materials may be used. Examples of the coupler are described in Research Disclosure No. 17643, VII-C to G and No. 307105, VII-C to G. The coupler is desirably a coupler having non-diffusivity and a hydrophobic group, referred to as a ballast group, or a coupler which does not have the hydrophobic group or a coupler which is polymerized. Examples of a cyan coupler include naphthol couplers, phenol couplers and the like, and are disclosed in U.S. Pat. Nos. 2,369,929, 2,772,162, 2,801, 171, 2,895,826, 3,446,622, 3,758,308, 3,772,002, 4,052,212, 4,126,396, 4,146,396, 4,228,233, 4,254,212, 4,296,199, 4,296,200, 4,327,173, 4,333,999, 4,334,011, 4,343,011, 4,427,767, 4,451,559, 4,690,889 and 4,775,616, West German Patent Laid-Open No.3,329, 729, European Patent Nos. 121,365A and 249,453A, JP-A No.61-42658 and the like. Examples of a magenta coupler include imidazole [1,2-b] pyrazoles disclosed in U.S. Pat. No. 4,500,630, pyrazolone [1,5-b][1,2,4] triazoles disclosed in U.S. Pat. No. 4,540,654 and the like.

Other examples of the magenta coupler include a pyrazolotriazole coupler in which a branched alkyl group is bonded to the 2, 3 or 6 position of a pyrazolotriazole ring, disclosed in JP-A No.61-65245; a pyrazoloazole coupler whose molecule includes a sulfonamide group, disclosed in JP-A No.61-65246; a pyrazoloazole coupler which has an alkoxyphenylsulfonamide ballast group, disclosed in JP-A No. 61-147254; a pyrazolotriazole coupler which has an alkoxy group or an aryloxy group at the 6 position thereof, disclosed in European Patent (Laid-Open) Nos. 226,849 and 294,785. Further examples of the coupler include couplers disclosed in U.S. Pat. Nos. 3,061,432, 3,725,067, 4,310,619, 4,351,897 and 4,556,630, European Patent No. 73,636, JP-A Nos. 55-118034, 60-35730, 60-43659, 60-185951 and 61-72238, International Application No. WO88/04795, Research Disclosure Nos. 24220 and 24230, and the like. Examples of a yellow coupler are disclosed in U.S. Pat. Nos. 3,933,501, 3,973,968, 4,022,620, 4,248,961, 4,314,023, 4,326,024, 4,401,752, 4,511,649, European Patent No. 249, 473A, JP-B No. 58-10739, UK Patent Nos. 1,425,020 and 1,476,760, and the like. Typical examples of a polymerized dye-forming coupler are disclosed in U.S. Pat. Nos. 3,451, 820, 4,080,211, 4,367,282, 4,409,320 and 4,576,910, European Patent No. 341,188A, UK Patent No. 2,102,137 and the like. Other examples of such a polymerized dye-forming coupler are disclosed in Japanese Patent Application Nos. 9-260336 and 9-271395 and the like.

The bivalent connecting group represented by $X_2$ in general formula (1) is preferably a bivalent group represented by the following structural formula,

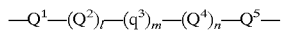

in which $Q^1$, $Q^2$, $Q^3$, $Q^4$ and $Q^5$ represent a connecting group for forming $X_2$, and m and n represent an integer of 0 or 1. Examples of $Q^1$, $Q^2$, $Q^3$, $Q^4$ and $Q^5$ include the following groups. $Q^1$ is positioned at a side at which a carbon atom is bonded and $Q^5$ is positioned at a side at which a nitrogen atom is bonded.

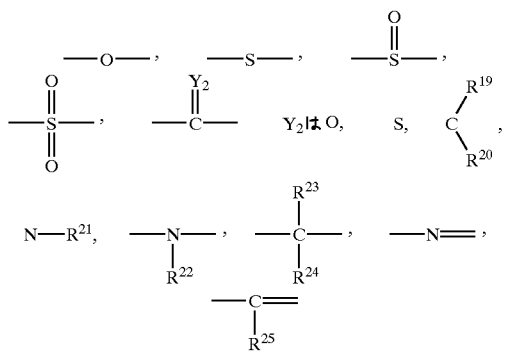

In the formulae $R^{19}$, $R^{20}$ and $R^{21}$ represent substituents. The substituents are the same as those represented by $R^{11}$. $R^{19}$, $R^{20}$ and R21 may form a ring with other atoms in $X_2$. $R^{22}$ represents a substituent, the same as those represented by $R^{11}$. $R^{22}$ may form a ring with other atoms in $X_2$. $R^{23}$ and $R^{24}$ represent substituents, the same as those represented by $R^{11}$. $R^{23}$ and $R^{24}$ may form a ring with other atoms in $X_2$. $R^{25}$ represents a substituent, and examples of the substituent are the same as those represented by $R^{11}$. $R^{25}$ may form a ring with other atoms in $X_2$.

In the above structural formula, $Q^1$, $Q^2$, $Q^3$, $Q^4$ and $Q^5$ may form independently an aryl group or a heterocyclic ring group (i.e., an allylene group or a bivalent heterocyclic ring group). Examples of the aryl group include a phenyl group, a chlorophenyl group, a methoxyphenyl group, a naphthyl group and the like. Examples of the heterocyclic ring group include pyrazole, imidazole, triazole, tetrazole, pyridine, pyrimidine, triazine, pyridazine, pyrazine, furan, thiophene, pyrrole, isoxazole, isothiazole, oxazole, thiazole and the like. The aryl group or the bivalent heterocyclic ring group may have bonding hands at any positions thereof. The aryl group or the heterocyclic ring group may have a substituent and examples of such a substituent include an alkyl group, an aryl group, a hydroxy group, a nitro group, a cyano group, a halogen group, an alkylsulfonyl group, an arylsulfonyl group, an alkoxycarbonyl group, an aryloxycarbonyl group, an acyl group, an amino group, an alkylamino group, a dialkylamino group, an acylamino group, an alkylsulfonylamino group, arylsulfonylamino group, a carbamoyl group, a sulfamoyl group, an alkylthio group, an arylthio group, a heterocyclic ring group, an alkoxy group and an aryloxy group. The aryl group may bond to a heterocyclic ring, and the heterocyclic ring group may bond to an aromatic ring. The aryl group or the heterocyclic ring group may be bonded at any positions of the ring.

The heterocyclic ring groups in $Q^1$, $Q^2$, $Q^3$, $Q^4$ and $Q^5$ may form, as shown in the following formulae, a sulfonium salt, an oxonium salt or a quaternary salt.

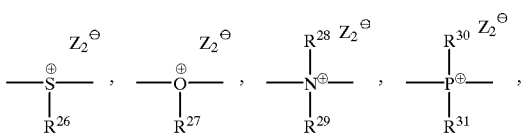

in which $R^{26}$ through $R^{31}$ represent an alkyl group or an aryl group, and examples of the alkyl group and the aryl group are the same as those represented by $R^{13}$ and $R^{14}$. $Z_2^-$ represents an anion. The anion may be an inorganic anion or an organic anion. Examples of the inorganic anion include a hexafluorophosphic acid ion, borofluoric hydroacid ion, chloride ion, bromide ion, hydrogensulfate ion and the like. Examples of the organic anion include a polyfluoroalkylsulfonic acid ion, polyfluoroalkylcarbonic acid ion, tetraphenylboric acid ion, aromatic carbonic acid ion, aromatic sulfonic acid ion and the like.

In general formula (1), a ring formed by $X_2$, a nitrogen atom and a carbon atom is preferably a five, six or seven member ring and more preferably a six member ring or a seven member ring. $Ar_2$ preferably has the following structure.

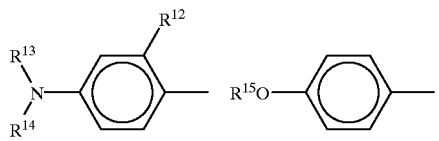

Cp preferably represents acylacetonitrides, pyrazolotriazoles, pyrazolones, pyridones, barbituric acids, pyrolotriazoles, naphthols, phenols or imidazoles. $Q^1$ in $X_2$ represents —O—, —S—, —N($R^{22}$)—, —N= or a bivalent heterocyclic ring, and $Q^5$ preferably represents —C(=O)— or —SO$_2$—. Further, combinations thereof are especially preferable.

Examples of the azomethine dye precursor represented by general formula (1) are described from paragraph [0052] to [0070] in Japanese Patent Application No. 2000-18425.

The deprotective agent is at least one kind selected from an acid, a base, an oxidizer, an alkylating agent and a metallic salt. Broadly, compounds having an active hydrogen may be used as the acid. The acid described herein refers to acids in a broad sense and includes, in addition to acids in a narrow sense, Lewis acids. Examples of the acid include organic acids including aliphatic carbonic acid, aromatic carbonic acid, sulfonic acids, phenols, naphthols, carbonamides, sulfonamides, ureas, thioureas, active methylene compounds. Examples of the base include organic bases including primary amines, secondary amines, tertiary amines, piperidines, piperazines, amidines, formamidines, pyridines, guanidines, morpholines and the like. A base precursor which generates the base may be used as the base. Here, the base refers to bases in a broad sense and includes, in addition to bases in a narrow sense, nucleophilic agents (Lewis bases). The base precursor is a compound which liberates a base when heated and examples of the base precursor include salts of bases and organic acids, and the like. Examples of the base which the base precursor forms preferably include those mentioned as bases. An ordinary Brønsted acid or Lewis acid may be used as the organic acid. A carbonic acid which releases a base by a decarboxylation reaction may also be used. Sulfonyl acetic acid and propiolic acid are preferable because the decarboxylation reaction occurs easily therewith. It is preferable if the sulfonyl acetic acid or the propiolic acid has an aromatic substituent (an aryl group or an unsaturated heterocyclic ring group), because then the decarboxylation reaction further accelerates. A base precursor of sulfonyl acetic acid salt is disclosed in JP-A No. 59-168441, and a base precursor of propiolic acetic acid is specifically disclosed in JP-A No. 59-180537.

Examples of the oxidizer include quinones, including 2,3-dichloro-5,6-dicyano-1,4-benzoquinone and tetrachloro-1,4-benzoquinone; nitro compounds, including nitrobenzene and m-nitrobenzenesulfonic acid; nitroso compounds, including nitrosobenzene; cations, including triphenylcations; azo compounds, including diethyl azodicarbonate; nitroxides, including diphenylnitroxide, porphyroxide, 2,2,6,6-tetramethylpiperidine-1-oxyl; N-oxides including pyridine-N-oxide; peracids including sodium perchlorate, potassium periodate, m-chloroperbenzoic acid; halogens including bromine and iodine; hypochlorites including sodium hypochlorite; metallic oxides including manganese dioxide. The oxidizer may be used alone or in a combination of two or more kinds. Examples of the alkylating agent include alkyl halides such as alkyl iodide, alkyl bromide, alkylsulfuric acid, sulfonates and the like. These alkyl groups may further have substituents, and examples of the substituents include an alkoxycarbonyl group, an aryloxycarbonyl group, a carbamoyl group, a sulfonyl group, a sulfamoyl group, and an acyl group. Examples of the metallic salt include metallic salts of compounds including, besides aliphatic carbonic acid and aromatic carbonic acid, which are mentioned as the acid, a mercapto group, a thione group and an imino group. Examples of the metallic atom include monovalent metals such as sodium, potassium, lithium, silver and the like; and multivalent metals such as zinc, magnesium, barium, calcium, aluminum, tin, titanium, nickel, cobalt, manganese, iron and the like. Especially, silver, zinc, aluminum, magnesium and calcium are preferable.

The content (mol) of the deprotective agent is 0.1 to 100 times, more preferably 0.5 to 30 times, as much as the content (mol) of the azomethine dye precursor.

In the light and heat sensitive recording layer (a), the azomethine dye precursor may be used as the color-forming component A, and the deprotective agent having a polymerizable group may be used as the compound B. A deprotective agent having a polymerizable group, such as an ethylene group or the like, within a molecule is preferable as the deprotective agent having a polymerizable group. Examples of the deprotective agent having a polymerizable group include a compound in which a polymerizable ethylene group, a (meth) acrylic group or a (meth) acrylamide group or the like is directly substituted with or substituted via a connecting group by the above-mentioned deprotective agent. Examples of such a deprotective agent are described in paragraphs [0234] to [0238] of Japanese Patent Application No. 2000-18425.

Examples of other combinations of color-forming component A and the compound B or C which reacts with the color-forming component A to form color include the following combinations (A) through (O). In each combination, the color-forming component A and then the compound B or C are mentioned, in that order.

(A) A combination of an organic acid metal salt, such as silver behenate, silver stearate or the like, and a reducer, such as protocatechinic acid, spiroindane, hydroquinone or the like.

(B) A combination of an iron salt of a long-chained fatty acid, such as iron (III) stearate, iron (III) myristinate or the like, and a phenol, such as tannic acid, gallic acid, ammonium salicylate or the like;

(C) A combination of a heavy metal salt of an organic acid, such as a nickel, cobalt, zinc, copper, iron, mercury or silver salt of acetic acid, stearic acid, palmitic acid or the like, and an alkali metal or alkaline earth metal sulfide, such as calcium sulfide, strontium sulfide, potassium sulfide or the like; or a combination of a heavy metal salt of an organic acid and an organic chelating agent, such as s-diphenylcarbazide, diphenylcarbazone or the like.

(D) A combination of a heavy metal sulfate salt, such as a sulfate of silver, zinc, mercury, sodium or the like, and a sulfur-containing compound, such as sodium tetrathionate, soda thiosulfate, thiourea or the like.

(E) A combination of an iron (III) salt of a fatty acid, such as iron (III) stearate, and an aromatic polyhydroxy compound, such as 3,4-hydroxytetraphenylmethane or the like.

(F) A combination of a metal salt of an organic acid, such as silver oxalate, mercury oxalate or the like, and an organic polyhydroxy compound, such as polyhydroxyalcohol, glycerin, glycol or the like.

(G) A combination of an iron (III) salt of a fatty acid, such as iron (III) pelargonate, iron (III) laurylate or the like, and a derivative of thiocesylcarbamide or isothiocesylcarbamide.

(H) A combination of a zinc salt of an organic acid, such as zinc caproate, zinc pelargonate, zinc behenate or the like, and a thiourea derivative, such as ethylenethiourea, N-dodecylthiourea or the like.

(I) A combination of a heavy metal salt of a higher fatty acid, such as iron (III) stearate, copper stearate or the like, and zinc dialkyldithiocarbamate.

(J) A combination which forms an oxazine dye, such as a combination of resorcinol and a nitroso compound.

(K) A combination of a formazan compound and a reducer and/or a metal salt.

(L) A combination of an oxidization-type color-forming agent and an oxidizer.

(M) A combination of a phthalonitrile and a diiminoisoindoline (i.e., a combination that generates phthalocyanine).

(N) A combination of an isocyanate and a diiminoisoindoline (i.e., a combination that generates a coloring pigment).

(O) A combination of a pigment precursor and an acid or a base (i.e., a combination that generates a pigment).

Among the above-mentioned combinations, the combination of an electron donating dye precursor and an electron accepting compound, a combination of a diazo compound and a coupler compound, a combination of a protected dye precursor and the deprotective agent, and a combination of a paraphenylene diamine derivative or para-aminophenol derivative oxidant precursor and a coupler compound are preferable. That is, as the color-forming component A, the electron donating dye precursor, the diazo compound, the protected dye precursor or the oxidant precursor is preferable. As the compound B or the compound C, the electron accepting compound, the coupler compound or the deprotective agent is preferable.

Next, the photo-polymerization initiator used in the light and heat sensitive recording layers (a) through (d) will be explained. The photo-polymerization initiator may be used in each of the light and heat sensitive recording layers (a) through (d). The photo-polymerization initiator can generate radicals when exposed to light and thereby cause the polymerization reaction within the layer. Further, the photo-polymerization initiator can accelerate the polymerization reaction. The recording layer film is cured by the polymerization reaction and thus a latent image of the desired image shape can be formed.

The photo-polymerization initiator preferably contains a spectral sensitization compound which has a wavelength of maximum absorption in the range of 300 to 1,000 nm, and a compound that interacts with the spectral sensitization compound. If the compound that interacts with the spectral sensitization compound is a compound which has within its structure both a dye portion having a wavelength of maximum absorption in the range of 300 to 1,000 nm and a borate, the spectral sensitization compound is not required. If a color image is to be formed, it is preferable to use a light and heat sensitive recording material that has a light and heat sensitive recording layer which containing the photo-polymerization initiator, which contains the spectral sensitization compound and the compound that interacts with the spectral sensitization compound.

As the spectral sensitization compound having a wavelength of maximum absorption at 300 to 1,000 nm, a spectral sensitization compound having a wavelength of maximum absorption in this wavelength range is preferable. High sensitivity can be obtained by selecting any desired dye from among spectral sensitization dyes of the aforementioned wavelength range, and adjusting the light-sensitivity wavelength to correspond to a light source to be used. The light source for image exposure can be appropriately selected from blue, green and red light sources and infrared lasers and the like. Accordingly, for example, in a case of forming a color image, in the light and heat sensitive recording material, which is formed by superposing monochrome light and heat sensitive recording layers that form the colors yellow, magenta and cyan, spectral sensitization dyes having different absorption wavelengths are present in the respective monochrome layers having different color-forming hues. By using light sources corresponding to the absorption wavelengths, because each layer (each color) in the recording material formed by superposing the plurality of layers has high sensitivity, an image with high sharpness can be formed. Thus, sensitivity enhancement and sharpness enhancement can be achieved for the whole multicolor light and heat sensitive recording material. Due to addition of the spectral sensitization dye, a desired color-forming density can be obtained at a lower energy.

Known compounds may be used as the spectral sensitization dye. Specific examples of the spectral sensitization dye include dyes disclosed in patent publications such as *Compounds which Interact with Spectral Sensitization Compounds*, described later, *Research Disclosure* (Vol. 200, December, 1980, Item 20036), Sensitizers (edited by Katsumi Tokumaru and Shin Ogawara, published by Kodansha Ltd. Publishers, pp. 160–163 (1987)) and the like. Specifically, a 3-ketocumarin compound disclosed in JP-A No. 58-15603, a thiopyrylium salt disclosed in JP-A No. 58-40302, naphthothiazol merocyanine compounds disclosed in JP-B Nos. 59-28328 and 60-53300, merocyanine compounds disclosed in JP-B Nos. 61-9621, 62-3842, 59-89303 and 60-60104 may be used. Moreover, dyes described in *Chemistry of Functional Dyes* (published by CMC Publishers, pp. 393–416 (1981)), *Color Materials*, (60(4) 212–224 (1987)), and the like may also be used. Specific examples include cation methine dyes, cation carbonium dyes, cation quinone imine dyes, cation indoline dyes, cation styryl dyes and the like.

Examples of the spectral sensitization dye include keto dyes such as cumarin (including ketocumarin or sulfonocumarin) dyes, merostyryl dyes, oxonol dyes, hemioxonol dyes and the like; non-keto dyes such as non-ketopolymethine dyes, triarylmethane dyes, xanthene dyes, anthracene dyes, rhodamine dyes, acridine dyes, aniline dyes, azo dyes and the like; non-ketopolymethine dyes such as azomethine dyes, cyanine dyes, carbocyanine dyes, dicarbocyanine dyes, tricarbocyanine dyes, hemicyanine dyes, styryl dyes and the like; and quinone imine dyes such as azine dyes, oxazine dyes, thiazine dyes, quinoline dyes, thiazol dyes and the like. Further, dyes disclosed in Japanese Patent Application No. 2000-94431 may also be used.

By appropriately using the spectral sensitization dye, the spectral sensitivity of the photo-polymerization initiator can be obtained in a range from UV light to infrared light. The above-mentioned various kinds of spectral sensitization dyes may be used alone or in a combination of two or more kinds. The amount of the spectral sensitization compound used in the light and heat sensitive recording layer is preferably 0.1 to 5% by weight and more preferably 0.5 to 2% by weight of the total amount of the light and heat sensitive recording layer.

One or two or more kinds of compounds which are able to start the photopolymerization reaction of the polymerizable group in the compound B or the compound D (a photo-polymerizable monomer) may be selected and used as the compound that interacts with the spectral sensitization compound. In particular, if this compound is used with the spectral sensitization compound, the compound will be highly sensitive to a light source for exposure that is in the spectral absorption wavelength range of the spectral sensitization compound. Accordingly, sensitivity enhancement can be achieved and generation of radicals can be controlled using a freely selected light source in a range from ultraviolet to infrared.

Specific examples of the compound that interacts with the spectral sensitization compound include organic borate salt compounds and compounds disclosed from paragraph [0145] to paragraph [0151] in Japanese Patent Application No. 11-36308. Among "compounds which interact with the spectral sensitization compound", organic borate compounds, benzoinethers, S-triazine derivatives having a trihalogen-substituted methyl group, organic peroxides and azinium salt compounds are preferable, and organic borate compounds are more preferable. By using the spectral sensitization compound and the "compound that interacts with the spectral sensitization compound" together, at the time of exposure, radicals can be locally and effectively generated at the exposed portions, and sensitivity enhancement can be achieved.

Examples of the organic borate compounds include organic borate compounds (which may be referred to as "borate compound I" hereinafter) disclosed in JP-A Nos. 62-143044, 9-188685, 9-188686, 9-188710 and the like, or spectral sensitization dye-based borate compounds (which may be referred to as "borate compound II" hereinafter) obtained from cation dyes and the like.

Specific examples of the borate compounds I include, but are not limited to, compounds disclosed from paragraph [0154] to paragraph [0163] in Japanese Patent Application No. 11-36308.

The spectral dye-based organic borate compounds (i.e., borate compounds II) obtained from cation dyes may be used as disclosed in *Chemistry of Functional Dyes* (published by CMC Publishers, pp. 393–416 (1981)), Color Materials, (60 (4) 212–224 (1987)) and the like. Specifically, any cation dyes may be appropriately used that have a wavelength of maximum absorption in the wavelength range of 300 nm or more, preferably in the wavelength range of 400 to 1100 nm. Among cation dyes, cation methine dyes, polymethine dyes, triaryl methane dyes, indoline dyes, azine dyes, xanthene dyes, cyanine dyes, hemicyanine dyes, rhodamine dyes, azamethine dyes, oxazine dyes, acridine dyes and the like are preferable. Cation cyanine dyes, hemicyanine dyes, rhodamine dyes, and azamethine dyes are more preferable. The borate compound II obtained from an organic cation dye can be obtained using the organic cation dye and an organic boron compound anion with reference to a method disclosed in European Patent No. 223,587A1. Specific examples of the borate compound II obtained from cation dyes include, but are not limited to, compounds disclosed from paragraph [0168] to paragraph [0174] in Japanese Patent Application No. 11-36308.

As described above, the borate compound II is a multifunctional compound. In view of obtaining high sensitivity and sufficient decolorizability, it is preferable that the photo-polymerization initiator is formed by appropriately combining the spectral sensitization compound and the compound that interacts with the spectral sensitization compound. In this case, the photo-polymerization initiator is more preferably a photo-polymerization initiator (1), obtained by a combination of the spectral sensitization compound and borate compound I, or more preferably a photo-polymerization initiator (2), obtained by a combination of borate compound I and borate compound II. At this time, the usage ratio of the spectral sensitization dye to the organic borate compound in the photo-polymerization initiator is very important in view of obtaining sensitivity enhancement and sufficient decolorization due to irradiation of light in the fixing process.

In a case of the photo-polymerization initiator (1), in the photo-polymerization initiator, in addition to the ratio of the spectral sensitization compound to the borate compound I (=1/1: mole ratio) which ratio is required for the photopolymerization reaction, it is especially preferable that an amount of borate compound I necessary for sufficiently decolorizing the spectral sensitization compound which remains within the layer is added, in view of obtaining sensitivity enhancement and decolorizability. Namely, the ratio of the spectral sensitization dye/borate compound I is preferably 1/1 to 1/50, more preferably 1/1.2 to 1/30 and most preferably 1/1.2 to 1/20. If the ratio is less than 1/1, polymerization reactivity and decolorizability cannot be sufficiently obtained. A ratio of more than 1/50 is not preferable because the coating characteristic may deteriorate.

In the case of the photo-polymerization initiator (2), it is especially preferable that the borate compound I and the borate compound II are used in combination such that the borate portion is at least in an equimolar ratio with respect to the dye portion, in view of obtaining sufficient sensitivity enhancement and decolorizability. The ratio of the borate compound I to the borate compound II is preferably 1/1 to 50/1, more preferably 1.2/1 to 30/1 and most preferably 1.2/1 to 20/1. If the ratio is less than 1/1, few radicals are generated, and sufficient polymerization reactivity and decolorizability cannot be obtained. A ratio exceeding 50/1 is not preferable because sensitivity cannot be sufficiently obtained.

The total amount of the spectral sensitization compound and the organic borate compound in the photo-polymerization initiator is preferably 0.1 to 10% by weight, more preferably 0.1 to 5% by weight and most preferably 0.1 to 1% by weight, based on the amount used of the compound having a polymerizable group. If the total amount is less than 0.1% by weight, the effects of the present invention cannot be obtained. A total amount exceeding 10% by weight is not preferable because the storage stability may decrease and the coating characteristic may also decrease.

In order to accelerate the polymerization reaction, as an assistant, an oxygen scavenger or a reducing agent, such as a chain transfer agent of an active hydrogen donor or another compound which accelerates the polymerization in a chain-transfer manner, may be added to the photo-polymerizable composition of the light and heat sensitive recording materials (a) through (d). Examples of the oxygen scavenger include phosphines, phosphonates, phosphites, argentous salts and other compounds easily oxidized by oxygen. Specific examples of the oxygen scavenger include N-phenylglycine, -trimethylbarbituric acid, N,N-dimethyl-2,6-diisopropylaniline, and N,N,N-2,4,6-pentamethylanilinic acid. Examples of useful polymerization accelerators include thiols, thioketones, trihalomethyl compounds, lophine dimer compounds, iodonium salts, sulfonium salts, azinium salts, organic peroxides and azides, and the like.

A protective layer may be provided in the light and heat sensitive recording material used with the present invention, if desired. The protective layer may be a single layer structure or may be a laminated structure of two or more layers.

Examples of materials used for the protective layer include water-soluble polymer compounds such as gelatin, polyvinyl alcohol, carboxy modified polyvinyl alcohol, vinyl acetate-acrylamide copolymer, silicon modified polyvinyl alcohol, starch, modified starch, methylcellulose, carboxymethylcellulose, hydroxymethylcellulose, gelatin, gum arabic, casein, a styrene-maleic acid copolymer hydrolysate, a styrene-maleic acid copolymer half ester hydrolysate, an isobutylene-maleic anhydride copolymer hydrolysate, polyacrylamide derivatives, polyvinylpyrolidone, polystyrene sodium sulfonate, sodium alginate and the like; and latexes such as a styrene-butadiene rubber latex, an acrylonitrile-butadiene rubber latex, a methyl acrylate-butadiene rubber latex, a vinyl acetate emulsion and the like.

By cross-linking the water-soluble polymer compound used for the protective layer, storage stability can be further improved. In this case, a known cross-linking agent may be used as a cross-linking agent for cross-linking. Specific examples of the cross-linking agent include water-soluble initial condensates such as N-methylolurea, N-methylolmelamine, urea-formaline and the like, dialdehyde compounds such as glyoxal, glutaraldehyde and the like, inorganic cross-linking agents such as boric acid, borax and the like, and polyamide epichlorohydrine and the like.

Further, known pigments, metal soaps, waxes, surfactants and the like may be used in the protective layer. Known UV absorbents and UV absorbent precursors may be added. The coated amount of the protective layer is preferably 0.2 to 5 g/m$^2$ and more preferably 0.5 to 3 g/m$^2$.

The light and heat sensitive recording material used with the present invention is formed by superposing three light and heat sensitive recording layers, yellow, magenta and cyan, on a support. The light and heat sensitive recording material contains microcapsules which contain color-forming components having different color-forming hues. and photo-polymerizable compositions which are sensitive to lights of different wavelengths. Thus, a color image can be formed. By using the spectral sensitization compounds, each of which has a different absorption wavelength, the photo-polymerizable compositions which are sensitive to lights of different wavelengths can be formed. In this case, intermediate layers may be provided between the light and heat sensitive recording layers of the respective colors.

The light and heat sensitive recording layers of the multilayer light and heat sensitive recording material for color image formation may be obtained, for example, as follows. On a support is provided a first recording layer, which contains microcapsules which contain a color-forming component that forms the color yellow and a photo-polymerizable composition which is sensitive to a central wavelength $\lambda_1$ of a light source. On the first recording layer is provided a second recording layer, which contains microcapsules which contain a color-forming component that forms the color magenta and a photo-polymerizable composition which is sensitive to a central wavelength $\lambda_2$. On the second recording layer is provided a third recording layer, which contains microcapsules which contain a color-forming component that forms the color cyan and a photo-polymerizable composition which is sensitive to a central wavelength $\lambda_3$. The light and heat sensitive recording layer may be formed such that a protective layer is provided and intermediate layers are provided between the respective recording layers, if necessary. The central wavelengths $\lambda_1$, $\lambda_2$ and $\lambda_3$ of the respective light sources are different from each other.

When image formation is carried out using this multilayer light and heat sensitive recording material for color image formation, in the exposure process, image exposure is carried out using a plurality of light sources having different wavelengths corresponding to the absorption wavelengths of the light and heat sensitive recording layers. As a result, the recording layers having the absorption wavelengths of the light sources selectively form respective latent images. Thus, a multicolor image having high sensitivity and high sharpness can be formed. Further, by irradiating the surface of the light and heat sensitive recording layer with light after transfer to an image receiving material, coloring of the background portion due to the photo-polymerization initiator, such as the spectral sensitization compound remaining within the layers, can be decolorized, and an image with high contrast and high quality can be formed.

In the light and heat sensitive recording material used for the present invention, the electron donating colorless dye or diazonium salt compound (which hereinafter may be occasionally referred to as the color-forming component) is encapsulated in microcapsules before use. Examples of methods of microcapsulation include conventionally known methods.

Examples of these microencapsulation methods include methods described in: U.S. Pat. Nos. 2,800,457 and 2,800,458, in which coacervation of a hydrophilic wall forming material is utilized; U.S. Pat. No. 3,287,154, UK Patent No. 990443, and JP-B Nos. 38-19574, 42-446 and 42-771, and the like, in which interfacial polymerization is utilized; U.S. Pat. Nos. 3,418,250 and 3,660,304, in which precipitation of a polymer is utilized; U.S. Pat. No. 3,796,669, in which an isocyanate polyol wall material is utilized; U.S. Pat. No. 3,914,511, in which an isocyanate wall material is utilized; U.S. Pat. Nos. 4,001,140, 4,087,376, and 4,089,802, in which a urea/formaldehyde type or urea/formaldehyde/resorcinol type wall forming material is used; U.S. Pat. No. 4,025,455, in which a wall-forming material such as a melamine/formaldehyde resin, hydroxypropyl cellulose or the like is utilized; JP-B No. 36-9168 and JP-A No. 51-9079, in which in situ methods using monomer polymerization are utilized; UK Patent Nos. 952807 and 965074, in which an electrolytic dispersion and cooling method is utilized; U.S. Pat. No. 3,111,407 and UK Patent No. 930422, in which a spray drying method is utilized; and the like.

The microencapsulation methods are not limited to the aforementioned methods, but in the light and heat sensitive recording material used for the present invention, in particular, an interfacial polymerization method is preferably used. In this method, an oil phase, which is prepared by dissolving or dispersing a color-forming component in a hydrophobic organic solvent to serve as the core of the capsules, is mixed with an aqueous phase, in which a water-soluble polymer is dissolved, and this mixture is emulsified and dispersed by a homogenizer or the like. Then, a polymer-forming reaction is caused at the interface between the oil phase and the aqueous phase by heating, such that microcapsule walls can be formed of a polymer substance. That is, in the interfacial polymerization method, capsules with a uniform particle diameter can be formed within a short time, and a recording material with excellent storage stability can be obtained.

A reactant which forms the microcapsule wall of the polymer is added within oil droplets and/or outside the oil droplets. Specific examples of the polymer substance include polyurethane, polyurea, polyamide, polyester, polycarbonate, urea-formaldehyde resin, melamine resin, polystyrene, a styrene-methacrylate copolymer, a styrene-acrylate copolymer and the like. Among these polymer substances, polyurethane, polyurea, polyamide, polyester, and polycarbonate are preferable, and polyurethane and polyurea are especially preferable. The above-mentioned polymer substances may be used in a combination of two or more. Examples of the water-soluble polymer include gelatin, polyvinyl pyrolidone, polyvinyl alcohol and the like.

For example, when polyurethane is used as the capsule wall material, microcapsule walls are formed as follows. First, a polyhydric isocyanate and a second material (for example, a polyol or polyamine) which will react with the polyhydric isocyanate to form the microcapsule walls, are mixed with each other in a water-soluble polymer-aqueous solution (aqueous phase) or in an oil medium (oil phase) which is to be encapsulated. Then, the mixture is emulsified and dispersed. Finally, by heating, the polymer forming reaction is caused at the interface between the aqueous phase and the oil phase, such that the microcapsule walls are formed. Examples of the polyhydric isocyanate and the polyol or polyamine which reacts with the polyhydric isocyanate include materials disclosed in U.S. Pat. Nos. 3,281,383, 3,773,695 and 3,793,268, JP-B Nos. 48-40347 and 49-24159, and JP-A Nos. 48-80191 and 48-84086.

When the microcapsules which contain the color-forming component are prepared, the encapsulated color-forming component may be present in the capsules in a liquid state or in a solid state. Examples of solvents which can be used are the same solvents as those used when emulsification-dispersing the photo-curable composition. If the electron donating colorless dye or diazonium salt compound is encapsulated in the capsules in a liquid state, the electron donating colorless dye or diazonium salt compound is encapsulated in a state in which it is dissolved in a solvent. In this case, the amount of the solvent is preferably 1 to 500 parts by weight per 100 parts by weight of the electron donating colorless dye. If the solubility of the electron donating colorless dye or diazonium salt compound to be encapsulated with respect to the solvent is low, a low-boiling-point solvent having high solubility may be used as an assistant. Examples of the low-boiling-point solvent include ethyl acetate, propyl acetate, isopropyl acetate, butyl acetate, methylene chloride and the like.

An aqueous solution in which the water-soluble polymer is dissolved is used as the aqueous phase. The oil phase is charged into the aqueous phase, and then emulsification dispersion is carried out by a homogenizer or the like. The water-soluble polymer enables uniform and easy dispersion, as well as acting as a dispersion medium which stabilizes the emulsification-dispersed aqueous solution. In order to carry out more uniform emulsification dispersion and stabilization, a surfactant may be added to at least one of the oil phase and the aqueous phase. Known surfactants for emulsions may be used as the surfactant. If the surfactant is added, the added amount of the surfactant is 0.1 to 5% and especially preferably 0.5 to 2% with respect to the amount by weight of the oil phase. As a surfactant contained in the aqueous phase, among anionic and ionic surfactants, a surfactant which acts as a protective colloid and does not cause precipitation or aggregation can be appropriately selected and used. Preferable examples of the surfactant include sodium alkyl benzene sulfonate, sodium alkyl sulfate, a sodium salt of dioctyl sulfosuccinate, polyalkylene glycol (for example, polyoxyethylene nonylphenylether) and the like.

As described above, the water-soluble polymer contained as the protective colloid in the aqueous phase mixed with the oil phase may be appropriately selected from known anionic polymers, nonionic polymers and amphoteric polymers. Examples of the anionic polymer include natural polymers and synthetic polymers, and for example, polymers having a —COO— or —SO2— group and the like. Specific examples of anionic polymers include natural polymers such as gum arabic, alginic acid, pectin and the like; semi-synthetic products such as carboxymethylcellulose, gelatin derivatives such as gelatin phthalate and the like, starch sulfate, cellulose sulfate, lignin sulfonic acid and the like; synthetic products such as maleic anhydride (including hydrolysates) copolymers, acrylic acid (methacrylic acid) polymers and copolymers, vinylbenzenesulfonic acid polymers and copolymers, carboxy-modified polyvinylalcohols and the like. Examples of nonionic polymers include polyvinyl alcohol, hydroxyethyl cellulose, methylcellulose and the like. Examples of amphoteric polymers include gelatin and the like. Of these, gelatin, gelatin derivatives and polyvinyl alcohol are preferable. The water-soluble polymer is used as a 0.01 to 10% by weight aqueous solution.

All components contained in the light and heat sensitive recording layer such as the color-forming component can be used by being solid-dispersed together with, for example, a water-soluble polymer, a sensitizer and other color-forming aids and the like, by a sand mill or the like. However, it is preferable to dissolve a slightly water-soluble or water-insoluble high-boiling-point organic solvent in water in advance, mix this solution with the polymer aqueous solution (aqueous phase) which contains the surfactant and/or the water-soluble polymer serving as the protective colloid, and use this mixed solution as an emulsified dispersion, which is emulsified using a homogenizer or the like. In this case, if necessary, a low-boiling-point solvent may be used as a dissolving aid. All components such as the aforementioned color-forming component can be emulsified and dispersed separately or can be mixed together in advance, dissolved in the high-boiling-point solvent and then emulsification dispersed. The diameter of the particles formed by emulsifying and dispersing is preferably 1 μm or less.

Emulsification can be easily carried out such that the oil phase containing the aforementioned components and the aqueous phase containing the protective colloid and the surfactant are mixed together using a usual means for emulsifying fine particles, such as high speed stirring, ultrasonic dispersing or the like, for example, a known emulsifying device such as a homogenizer, a Manton Gaulin, an ultrasonic disperser, a dissolver, a KADY mill or the like. After emulsifying, in order to accelerate the capsule wall formation reaction, the emulsion is heated to 30 to 70° C. During the reaction, in order to prevent aggregation of capsules, it is necessary to add water so as to decrease the incidence of capsule collisions, or to stir thoroughly. Further, during the reaction, a dispersion for preventing aggregation may be added separately. It will be observed that carbon dioxide gas is generated as the polymerization reaction proceeds. When generation of the carbon dioxide gas ends, it can be considered that the capsule wall formation reaction has finished. Usually, the microcapsules which encapsulate the desired dye are obtained by reacting for a few hours.

In the light and heat sensitive recording material used with the present invention, the average particle diameter of the microcapsules is preferably 20 μm or less and more preferably 5 μm or less in view of obtaining high resolution. If the diameter of the formed microcapsules is too small, the surface area with respect to a fixed amount of solids will be too large, and a large amount of the wall material will be needed. Thus, the average particle diameter is preferably at least 0.1 µm.

If a color image is to be formed, the light and heat sensitive recording layers corresponding to the three hues of the light and heat sensitive recording material are formed such that monochrome light and heat sensitive recording layers are superposed on a support. The respective light and heat sensitive recording layers contain microcapsules which contain the electron donating colorless dyes that form color of the different hues and the photo-polymerizable compositions which contain the spectral sensitization dyes having different wavelengths of maximum absorption. When light is irradiated, the photosensitive thermal layers are sensitized by the different wavelengths of the light sources to form a multicolor image.

Intermediate layers may be provided between the respective monochrome light and heat sensitive recording layers for forming the light and heat sensitive recording layers. The intermediate layer is formed mainly of a binder and may contain, as necessary, additives such as a curing agent, a polymer latex and the like.

In the light and heat sensitive recording material used with the present invention, a binder for each of the layers, including the protective layer, the photosensitive thermal layers, the intermediate layers and the like can be, besides the binder used for emulsification dispersing the photo-polymerizable composition and the water-soluble polymer used for encapsulating the color-forming component, a solvent-soluble high polymer such as polystyrene, polyvinylformal, or polyvinylbutyral; an acrylic resin, such as polymethyl acrylate, polybutyl acrylate, polymethyl methacrylate, polybutyl methacrylate and copolymers thereof; a phenol resin, a styrene/butadiene resin, ethyl cellulose, an epoxy resin, a urethane resin, or the like; and high polymer latexes of these can be used. Among these binders, gelatin and polyvinyl alcohol are preferable.

Various surfactants may be used for each light and heat sensitive recording layer of the light and heat sensitive recording material of the present invention, for purposes such as coating assistance, static prevention, lubricity improvement, emulsification for dispersion, adhesion prevention, and the like. Examples of surfactants include non-ionic surfactants such as saponin and polyethylene oxide derivatives such as polyethylene oxide, alkyl ether of polyethylene oxide, and the like; anionic surfactants such as alkyl sulfonate, alkylbenzene sulfonate, alkylnaphthalene sulfonate, alkylsulfuric acid ester, N-acyl-N-alkyltaurines, sulfosuccinate ester, sulfoalkylpolyoxyethylenealkyl phenyl ether, and the like; amphoteric surfactants such as alkylbetaines, alkylsulfobetaines and the like; and cationic surfactants such as aliphatic groups, aromatic quaternary ammonium salts and the like.

In addition to the aforementioned additives, other additives may be added to the light and heat sensitive recording layers as necessary. Examples of the additives include a dye, a UV ray absorber, a plasticizer, a fluorescent whitening agent, a matting agent, a coating assistant, a curing agent, an antistatic agent, a slip-improving agent and the like. Typical examples of these additives are described in Research Disclosure, Vol. 176 (December, 1978, Item 17643) and Research Disclosure, Vol. 187 (November, 1978, Item 18716).

In the light and heat sensitive recording material of the present invention, a curing agent may be used, as necessary, in the respective layers, such as the light and heat sensitive recording layers, the intermediate layers, the protective layer and the like. In particular, it is preferable to use a curing agent in the protective layer, to decrease viscosity of the protective layer. Examples of the curing agent include "gelatin curing agents" used for manufacturing photographic photosensitive materials, such as formaldehyde-based compounds such as formaldehyde, glutaraldehyde and the like, a reactive halogen compound disclosed in U.S. Pat. No. 3,635,718, compounds having a reactive ethylene unsaturated group disclosed in U.S. Pat. No. 3,635,718, an azirizine-based compound disclosed in U.S. Pat. No. 3,017,280, an epoxy-based compound disclosed in U.S. Pat. No. 3,091,537, halogenocarboxyaldehydes such as mucochloric acid, dioxanes such as dihydrodioxane, dichlorodioxane and the like, vinylsulfones disclosed in U.S. Pat. Nos. 3,642,486 and 3,687,707, vinylsulfone precursors disclosed in U.S. Pat. No. 3,841,872 and ketovinyls disclosed in U.S. Pat. No. 3,640,720. Examples of inorganic curing agents are chrome alum, zirconium sulfate, boric acid and the like. Among these curing agents, 1,3,5-triacryloyl-hexahydro-s-triazine, 1,2-bisvinylsulfonylmethane, 1,3-bis (vinylsulfonylmethyl) propanol-2, bis($\alpha$-vinylsulfonylacetoamide)ethane, 2,4-dichloro-6-hydroxy-s-triazine/sodium salt, 2,4,6-triethyleneimino-s-triazine, boric acid and the like are preferable. The added amount of the curing agent is preferably 0.5 to 5% by weight with respect to the amount of the binder.

The light and heat sensitive recording material used for the present invention can be formed such that after preparing coating liquids for the light and heat sensitive recording layers, a coating liquid for a heat-bonding layer and the like using means for dissolving the respective components in the solvents as necessary, the layers are coated on a desired support and dried.

Examples of a solvent used for preparation of a coating liquid include water; alcohols such as methanol, ethanol, n-propanol, isopropanol, n-butanol, sec-butanol, methyl cellosolve, and 1-methoxy-2-propanol; halogen solvents such as methylene chloride and ethylene chloride; ketones such as acetone, cyclohexanone, and methyl ethyl ketone; esters such as methyl acetate cellosolve, ethyl acetate, and methyl acetate; toluene; xylene, and the like. These solvents may be used either singly or in a combination of two or more. Among these, water is particularly preferable.

The coating liquid for each light and heat sensitive recording layer is applied to the support with a blade coater, a rod coater, a knife coater, a roll doctor coater, a reverse roll coater, a transfer roll coater, a gravure coater, a kiss roll coater, a curtain coater, an extrusion coater, or the like. The method of application may be effected with reference to *Research Disclosure*, Vol. 200 (December 1980, Item 20036, page XV). The thickness of the light and heat sensitive recording layer is preferably 0.1 to 50 µm and more preferably 5 to 35 µm.

Examples of the support used for the light and heat sensitive recording material of the present invention include paper; synthetic papers such as coated paper, laminated paper and the like; films such as polyethylene terephthalate film, cellulose triacetate film, polyethylene film, polystyrene film, polycarbonate film and the like; plates of metals such as aluminum, zinc, copper and the like; and supports on whose surfaces various treatments, such as surface processing, undercoating, metal deposition or the like, have been carried out. The supports disclosed in *Research Disclosure*, Vol. 200 (December, 1980, Item 20036, page XVII) may be used. Further, a polyurethane sheet, a rubber sheet or the like, which has inherent elasticity, may be used. Further, if necessary, an anti-halation layer may be provided on the surface of the support to be used. A sliding layer, an anti-static layer, a curl preventing layer, an adhesive layer and the like may be provided on a back surface of the support.

In the present invention, in addition to light and heat sensitive recording materials that have the above-described light and heat sensitive recording layers (a) through (d), light and heat sensitive recording materials including light and heat sensitive recording layers (e) and (f) may be appropriately used. The light and heat sensitive recording layers (e) and (f) are as follows.

The photo-curable photosensitive thermal layer (e) includes an oxidant precursor E which is encapsulated in thermally-responsive microcapsules, an activator G which exists outside the thermally-responsive microcapsules and which reacts with the oxidant precursor E to generate an oxidant F, and a dye forming coupler H which couples to the oxidant F to generate a dye. By irradiation of light, an irradiated portion of the light and heat sensitive recording layer (e) is cured.

The light and heat sensitive recording layer (f) includes the oxidant precursor E, outside the thermally-responsive microcapsules, the activator G which is encapsulated in the thermally-responsive microcapsules and which reacts with the oxidant precursor E to generate the oxidant F, and the dye forming coupler H which couples to the oxidant F to form a dye. By irradiation of light, an irradiated portion is cured.

In the light and heat sensitive recording layer (e), by carrying out exposure of the desired image shape, the irradiated portion is cured and a latent image of the desired image shape is formed. Next, the activator G present in the unexposed portion moves within the recording material due to heating, and reacts with the oxidant precursor E within the capsules to generate the oxidant F. The generated oxidant F couples to the dye forming coupler H to form a dye (to form color). Accordingly, the light and heat sensitive recording layer (e) is a positive light and heat sensitive recording layer in which color is not formed at the exposed portion and uncured portions, the unexposed portion, form color so that an image is formed. Examples of such a light and heat sensitive recording layer include a light and heat sensitive recording layer disclosed in Japanese Patent Application No. 11-324548, which layer contains a para-phenylenediamine derivative or para-aminophenol derivative oxidant precursor which is encapsulated in microcapsules, a dye forming coupler, an activator which exists outside the microcapsules and which reacts with the oxidant precursor to form a para-phenylenediamine derivative or para-aminophenol derivative oxidant, a photo-polymerizable monomer, and a photo-polymerization initiator. In this light and heat sensitive recording layer, the photo-polymerizable monomer is polymerized and cured by exposure, so that a latent image is formed. Thereafter, the activator present at the unexposed portion moves within the recording material when heated, and reacts with the para-phenylenediamine derivative or para-aminophenol derivative oxidant precursor within the microcapsules to generate, within the microcapsules, the para-phenylenediamine derivative or para-aminophenol derivative oxidant, which is a color-forming developing agent. The color-forming developing agent oxidant further reacts with the dye forming coupler within the microcapsules to form color. Thus, color is not formed at the cured latent image portion of the exposed portion and only the uncured portions form color, so that a positive image with high contrast and high sharpness can be formed.

In the light and heat sensitive recording layer (f), by effecting exposure of the desired image shape, the irradiated portion of the layer is cured, so that a latent image of the desired image shape is formed. Next, the oxidant precursor E present at the unexposed portion moves within the recording material during heating, and reacts with the activator G within the microcapsules to generate the oxidant F. The generated oxidant F couples to the dye forming coupler H to form a dye (to form color). Accordingly, the light and heat sensitive recording layer (f) is a positive light and heat sensitive recording layer in which color is not formed at the exposed portion and color is formed at the uncured portions, the unexposed portion, so that an image is formed. Specific examples of such a light and heat sensitive recording layer include a light and heat sensitive recording layer disclosed in Japanese Patent Application No. 11-324548, which layer contains a para-phenylenediamine derivative or para-aminophenol derivative oxidant precursor outside microcapsules, an activator which is encapsulated in the microcapsules and which reacts with the oxidant precursor to generate a para-phenylenediamine derivative or para-aminophenol derivative oxidant, a dye-forming coupler, a photo-polymerizable monomer, and a photo-polymerization initiator. In this light and heat sensitive recording layer, the photo-polymerizable monomer is polymerized and cured by exposure, so that a latent image is formed. Thereafter, the para-phenylenediamine derivative or para-aminophenol derivative oxidant precursor which exists at the exposed portion is moved within the recording material by heating, and reacts with the activator within the microcapsules so as to generate, within the microcapsules, the para-phenylenediamine derivative or para-aminophenol derivative oxidant, which is a color-forming developing agent. The color-forming developing agent oxidant further reacts with the dye-forming coupler within the microcapsules to form color. Accordingly, color is not formed at the cured latent image portion of the exposed portion, and only the uncured portions form color, so that a positive image with high contrast and high sharpness can be formed.

Hereinafter, components for forming the above-described light and heat sensitive recording layers (e) and (f) will be explained in detail. The oxidant F generated in the light and heat sensitive recording layers (e) and (f) is a color-forming developing agent oxidant. As the oxidant precursor E, a compound represented by the following general formula (2) may be used:

General formula (2)

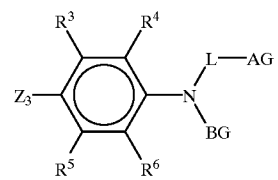

in which $Z_3$ represents a hydroxyl group or $-NR_1R_2$, and $R_1$ and $R_2$ each represents an alkyl group or an aryl group. Examples of $R_1$ and $R_2$ include a methyl group, an ethyl group, a propyl group, a dodecyl group, a 2-hydroxyethyl group, 2-cyanoethyl group, a cyanomethyl group, a 2-methoxyethyl group, a 2-ethoxycarbonylethyl group, a 2-(methylsulfonylamino) ethyl group, a phenyl group, a naphthyl group, and the like. $R_1$ and $R_2$ may bind to form a ring. In this case, the ring is preferably a five member ring, a six member ring or a seven member ring. If $Z_3$ represents a hydroxyl group, the hydroxyl group may be protected and used, if necessary. $R^3$, $R^4$, $R^5$ and $R^6$ each represents a hydrogen atom or a substituent. If $R^3$, $R^4$, $R^5$ or $R^6$ represents the substituent, examples of such a substituent include a halogen atom, an alkyl group, an aryl group, a hetero ring group a carbonamide group, a sulfonamide group, an alkoxy group, a teryloxy group, an alkylthio group, an arylthio group, an amino group, a carbamoyl group, a sulfamoyl group, a cyano group, a sulfonyl group, an alkoxycarbonyl group, an aryloxycarbonyl group, an acyl group, a ureido group, a urethane group, an acyloxy group and the like. $R^1$ and $R^3$, $R_1$ and $R^5$, $R^2$ and $R^3$ and $R^2$ and $R^5$ may bond with each other to form a hetero ring. In this case, the hetero ring is preferably a five member ring, a six member ring or a seven ring member. Further, $R^3$ and $R^4$, and $R^5$ and $R^6$ may bind with each other to form a ring. In this case, the ring may be a hetero ring or may be a carbon ring. Further, the ring may be a saturated ring, a partially unsaturated ring or an unsaturated ring, and the number of members in the ring is preferably five, six or seven.

—L—AG corresponds to the protective group, and AG represents a group which can interact with the activator. Examples of such a group include a carboxy group, a thiocarbonyl group, a selenocarbonyl group, a tellurocarbonyl group, a thioethyl group, a selenoether group, an amino group, an ether group, a hydroxy group (including enol and phenol), a carboamide group, a polyether group, a crown ether group, an azo group, a hydroxyimino group, an imino group, a carbonyl group, a hetero ring group containing a nitrogen atom or a sulfur atom within the ring, and the like. Among these, the carboxyl group, the thiocarbonyl group, the thioether group, the amino group, the hydroxy (including enol and phenol) group, the polyether group, the crown ether group, the hydroxyimino group, the imino group, and the hetero ring group including a nitrogen atom or a sulfur atom within the ring are more preferable. Further, the carboxyl group, the thiocarbonyl group, the amino group, the hydroxyimino group, and the hetero ring group including a nitrogen atom or a sulfur atom within the ring are most preferable. The aforementioned groups may be used in combination. A group which has the partial structure represented by the following general formula (3) is most preferable as AG:

General formula (3)

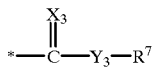

in which ★ represents a site which combines with L. $X_3$ represents a sulfur atom, a selenium atom or an =NOH group. $Y_3$ represents a sulfur atom, an oxygen atom, —N($R_8$)— or —C($R_9$) ($R_{10}$)—. More preferably, $Y_3$ represents a sulfur atom, an oxygen atom or —N($R_8$)—. $R^7$ represents an alkyl group, an aryl group or a hetero ring group. $R^8$, $R^9$ and $R^{10}$ each represents an alkyl group, an aryl group or a hetero ring group. $R^7$ and $R^8$, $R^7$ and $R^9$, $R^7$ and $R^{10}$, and $R^9$ and $R^{10}$ may bind with each other to form a ring. In this case, the number of members in the ring is preferably five, six or seven.

L represents a group which liberates a nitrogen atom with a bonding electron pair in general formula (2) as a result of interaction between the compound represented by the general formula (2) and the activator. Preferably, L represents a sulfur atom, —N ($R^{41}$)— or —C($R^{42}$)($R^{43}$)—. $R^{41}$ represents an alkyl group, an aryl group, a hetero ring group or a bonding arm. $R^{41}$ may bond to AG to form a ring. In this case, a preferable number of members in the ring is five, six or seven. $R^{42}$ and $R^{43}$ represent an alkyl group, an aryl group, a hetero ring group, a cyano group, a trifluoromethyl group, a sulfonyl group, a carbamoyl group, a halogen atom, an amide group, a sulfamoyl group, an acyl group or a bonding arm. $R^{42}$ and $R^{43}$, $R^{42}$ and AG, and $R^{43}$ and AG may bind with each other to form a ring. In this case, a preferable number of members in the ring is five, six or seven. At least one of $R^{42}$ and $R^{43}$ represents a group having a Hammett constant $\sigma_p$ (sigma para) of at least +0.3 (preferably a cyano group, a trifluoromethyl group, a sulfonyl group, a carbamoyl group or a sulfamoyl group (an acyl group or the like)).

In general formula (2), BG represents a block group, a group which is liberated in a process of dye formation. BG also has a function of stabilizing the compound represented by general formula (2) and, in view of this function, preferably represents an electron absorbing group. Preferable examples of BG include groups represented by the general formula (4), General formula (4)

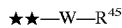

in which ★★ represents a position at which BG binds to a nitrogen atom in general formula (2). W represents a bivalent group having an electron absorbing property, such as —$SO_2$—, —CON($R^{45}$)—, —COO— or —$SO_2$N($R^{45}$)—. $R^{45}$ represents a hydrogen atom, an alkyl group or an aryl group, of which the hydrogen atom is preferable. W represents —CON($R^{45}$)—. $R^{44}$ represents an alkyl group, an aryl group, a hetero ring group or an alkoxy group, more preferably represents an alkyl group or an aryl group, and most preferably represents an alkyl group.

The amount of the oxidant precursor E used for one color is preferably in a range of 0.01 to 5 mmol/m$^2$ and more preferably in a range of 0.1 to 2 mmol/m$^2$. Specific examples of the oxidant precursor E represented by general formula (2) are described from paragraph [0015] to paragraph [0023] in Japanese Patent Application No. 11-324548.

Next, the activator G is explained. The activator G reacts with the para-phenylenediamine derivative or para-aminophenol derivative oxidant precursor to generate the para-phenylenediamine derivative or para-aminophenol derivative oxidant. Examples of the activator include an electrophilic agent and, especially, an electrophilic agent which utilizes a nucleophilic substitution reaction or a nucleophilic addition reaction of the oxidant precursor with a carbon atom contained in the electrophilic agent. Examples of such an activator include substances having structures represented by the following general formulae:

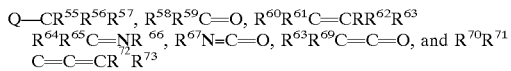

in which Q represents an atom or a group which is liberated by a nucleophilic reaction of AG of the oxidant precursor E represented by general formula (2) with respect to a bound carbon atom of Q. Examples of Q include a halogen atom, an alkylsulfoxyl group, an arylsulfoxyl group, and a carbamoyloxyl group. $R^{55}$ to $R^{75}$ represent a halogen atom or a substituent. Preferably at least one of $R^{60}$ to $R^{63}$ represents an electron absorbing group. Preferably at least one of each of $R^{55}$ to $R^{57}$, $R^{58}$ to $R^{59}$, and $R^{64}$ to $R^{66}$, and at least two of $R^{60}$ to $R^{63}$ represents an electron absorbing group. Further, the activator preferably has at least one polymerizable group.

Another preferable example of the activator G is a compound represented by general formula (5), General Formula (5)

in which M represents a metallic atom having an electric charge of b valence, and a represents an integer from 0 to 7. Preferable examples of the metallic atom which is preferable as M include titanium, vanadium, chromium, manganese, iron, cobalt, nickel, copper, zinc, zirconium, molybdenum, ruthenium, rhodium, palladium, silver, cadmium, mercury, tin, tungsten, rhenium, osmium, iridium, platinum, gold, mercury, thallium, lead and uranium.

$A_1$ represents an atomic group which neutralizes the electric charge of the metallic atom. Examples of $A_1$ include organic anions such as carbonic acid anions, sulfonic acid anions, sulfuric acid mono ester anions, phosphoric acid diester anions, β-ketoester anions, β-diketone anions, oxime anions, hydroxamic acid anions, tetraphenyl boric acid anions, and inorganic anions such as a phosphorus 6-fluoride anion, phosphorus 4-fluoride anion or the like.

In general formula (5), if b 0, $A_1$ need not neutralize the electric charge of M, and a represents 0 to 6. At this time, $A_1$ preferably represents a phosphine such as triphenyl phosphine. Specific examples of the above-described activator G are described in paragraph [0025] and from paragraph [0029] to paragraph [0032] of JP-A No. 11-324548.

Examples of the activator G include compounds represented by general formula (6), General Formula (6)

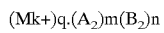

in which M represents a metallic atom having an electric charge of k valence. k represents an integer from 0 to 7. q represents an integer from 1 to 24. $A_2$ represents an atomic group which has a negative electric charge from 1 to 7 valence and which neutralizes the electric charge of the metallic atom M. m represents an integer from 0 to 24. If m is at least 2, each $A_2$ may be the same as or may be different from each other $A_2$, and may connect with each other. $B_2$ represents an atomic group represented by the following general formula (7), and n represents an integer from 1 to 24:

General formula (7)

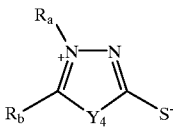

in which $Y_4$ represents O, S or N—$R_c$, and $R_a$ and $R_c$ represent substituents. $R_b$ represents a hydrogen atom or a substituent.

If n represents at least 2, each $B_2$ may be the same as or may be different from each other $B_2$, and may connect with each other. The compound represented by general formula (6) may further be bound to an atomic group which does not substantially neutralize other electric charges.

As the dye forming coupler H, couplers which are known as four-equivalent couplers and two-equivalent couplers in the field of silver halide photography photosensitive materials may be used. A two-equivalent coupler is preferable. In the oxidant precursor E represented by general formula (2), if W in BG is —$SO_2$—, a four-equivalent coupler is preferably used. With regard to such a dye forming coupler H, the coupler description in JP-A No. 8-286340 may be applied and disclosed couplers may be preferably used. More preferable examples of the coupler may also be used. Specific examples of compounds in JP-A No. 8-286340 may also be used.

The oxidant precursor E and the dye forming coupler H may be used at a freely selected molar ratio. The molar ratio (oxidant precursor/dye forming coupler) is preferably 0.01 to 100, more preferably 0.1 to 10 and most preferably 0.5 to 5. The oxidant precursor E and the activator G may be used at a freely selected molar ratio. The molar ratio (activator/oxidant precursor) is preferably 0.1 to 100, more preferably 0.2 to 50 and most preferably 0.5 to 50. Two or more kinds of each of the oxidant precursor E, the activator G and the dye forming coupler H may be mixed together and used.

As in the light and heat sensitive recording layers (b) to (d), by adding the photo-polymerizable compound D and the photo-polymerization initiator to the light and heat sensitive recording layers (e) and (f), a photo-curable light and heat sensitive recording layer can be formed. Further, a photo-curable light and heat sensitive recording layer can also be formed by making one of the oxidant precursor E, the activator G and the dye forming coupler H have a polymerizable group. By using, as the photo-polymerizable compound, the photo-polymerizable compound Dp, which has a strong interaction with either the oxidant F or the dye forming coupler H, a negative image can be obtained.

The same photo-polymerizable compound D and the photo-polymerization initiator as those used in the light and heat sensitive recording layers (b) to (d) may be used. Additives for the light and heat sensitive recording layer, structures of layers other than the light and heat sensitive recording layer and encapsulating methods have been already described.

With the image-recording device of the present invention, by irradiating light onto and heating a developed portion of a light and heat sensitive recording material, an image can be fixed rapidly, even if the output of the irradiated light is low. As a result, the processing speed of the whole device can be increased.

What is claimed is:

1. An image-recording device comprising:
an optical recording section which exposes a light and heat sensitive recording material with light for recording a latent image;
a heat-development section, which develops the latent image by heating; and
a photo-fixing section, which brings a film surface of the light and heat sensitive recording material to a temperature from 30 to 200° C. and irradiates light onto the light and feat sensitive recording material for fixing the developed image.

2. The image-recording device according to claim 1, wherein the optical recording section has a light source, and the light source is a laser light source which has an intensity maximum in a wavelength range from 300 to 1,100 nm.

3. The image-recording device according to claim 1, wherein a maximum irradiation light amount at the optical recording section is from 0.01 to 50 mJ/cm$^2$.

4. The image-recording device according to claim 1, wherein a heating temperature at the heat-development section is from 50 to 200° C.

5. The image-recording device according to claim 1, wherein an intensity of illumination of the film surface of the light and heat sensitive recording material at the photo-fixing section is from 20,000 to 6,000,000 lux·s.

6. The image-recording device according to claim 1, wherein the film surface of the light and heat sensitive recording material is brought to a temperature from 50 to 140° C. at the photo-fixing section.

7. The image-recording device according to claim 6, wherein the film surface of the light and heat sensitive recording material is brought to a temperature from 50 to 120° C. at the photo-fixing section.

8. The image-recording device according to claim 1, wherein the light source of the photo-fixing section is provided separately from the light source of the optical recording section.

9. The image-recording device according to claim 1, wherein the light source of the optical recording section is combined with the light source of the photo-fixing section.

10. The image-recording device according to claim 1, wherein the light and heat sensitive recording layer which contains thermally-responsive microcapsules, which encapsulate a color-forming component and, outside the microcapsules, a photo-polymerizable composition, which comprises at least a substantially colorless compound that reacts with the color-forming component to form color, a photo-polymerizable compound that has a site that suppresses reaction of the color-forming component with the compound, and a photo-polymerization initiator.

11. The image-recording device according to claim 1, wherein light and heat sensitive recording layer which contains thermally-responsive microcapsules, which encapsulate a substantially colorless compound that reacts with a color-forming component to form color and, outside the microcapsules, a photo-polymerizable composition, which includes at least the color-forming component, a photo-polymerizable compound and a photo-polymerization initiator.

12. The image-recording device according to claim 9, wherein the light and heat sensitive recording layer which contains thermally-responsive microcapsules, which encapsulate a substantially colorless compound that reacts with a color-forming component to form color and, outside the microcapsules, a photo-polymerizable composition, which includes at least the color-forming component, a photo-polymerizable compound and a photo-polymerization initiator.

13. An image-recording device, comprising:

an optical recording section which exposes a light and heat sensitive recording material with light for recording a latent image;

a heat-development section, which develops the latent image by heating; and a photo-fixing section, which brings a film surface of the light and heat sensitive recording material to a temperature between 30 to 200° C. and which irradiates light onto the light and heat sensitive recording material for fixing the developed image, wherein the light and heat sensitive recording material contains thermally-responsive microcapsules, which encapsulate a color-forming component and, outside the microcapsules, a photo-polymerizable composition, which comprises at least a substantially colorless compound that has, within the same molecule, a polymerizable group and a site that reacts with the color-forming component to form color and a photo-polymerization initiator.

14. The image-recording device according to claim 13, wherein the optical recording section has a light source, and the light source is a laser light source which has an intensity maximum in a wavelength range from 300 to 1,100 nm.

15. The image-recording device according to claim 13, wherein a heating temperature at the heat-development section is from 50 to 200° C.

16. The image-recording device according to claim 13, wherein the film surface of the light and heat sensitive recording material is brought to a temperature from 50 to 140° C. at the photo-fixing section.

17. An image-recording device comprising:

an optical recording section, which exposes a light and heat sensitive recording material with light for recording a latent image;

a heat-development section, which develops the latent image by heating; and a photo-fixing section, which brings a film surface of the light and heat sensitive recording material to a temperature from 30 to 200° C. and which irradiates light onto the light and heat sensitive recording material for fixing the developed image, wherein the light and heat sensitive recording material contains thermally-responsive microcapsules, which encapsulate a color-forming component and, outside the microcapsules, a photo-polymerizable composition, which comprises at least a substantially colorless compound that reacts with the color-forming component to form color, a photo-polymerizable compound and a photo-polymerization initiator.

18. The image-recording device according to claim 17, wherein the optical recording section has a light source, and the light source is a laser light source which has an intensity maximum in a wavelength range from 300 to 1,100 nm.

19. The image-recording device according to claim 17, wherein a heating temperature at the heat-development section is from 50 to 200° C.

20. The image-recording device according to claim 17, wherein the film surface of the light and heat sensitive recording material is brought to a temperature from 50 to 140° C. at the photo-fixing section.

* * * * *